(12) United States Patent
Huang et al.

(10) Patent No.: US 8,772,893 B2
(45) Date of Patent: Jul. 8, 2014

(54) PIXEL STRUCTURE HAVING PIXEL ELECTRODE DISPOSED ON COLOR FILTER PATTERN AND ELECTRICALLY CONNECTED TO UNDERLYING ACTIVE DEVICE

(75) Inventors: Yen-Heng Huang, Taipei County (TW); Chung-Kai Chen, Taichung County (TW); Chia-Hui Pai, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/594,892

(22) Filed: Aug. 27, 2012

(65) Prior Publication Data

US 2012/0313132 A1  Dec. 13, 2012

Related U.S. Application Data

(62) Division of application No. 12/721,571, filed on Mar. 11, 2011, now Pat. No. 8,283,197.

(30) Foreign Application Priority Data

Aug. 4, 2009 (TW) .................. 98126229 A

(51) Int. Cl.
  *H01L 31/0224* (2006.01)
  *H01L 31/0232* (2014.01)
(52) U.S. Cl.
  USPC .................. 257/435; 257/448; 257/E31.122; 257/E31.127
(58) Field of Classification Search
  USPC .................. 438/90; 257/E31.113, E31.122
  See application file for complete search history.

(56) References Cited

U.S. PATENT DOCUMENTS

| | | | | |
|---|---|---|---|---|
| 2006/0006385 | A1* | 1/2006 | Park | 257/59 |
| 2006/0146254 | A1* | 7/2006 | Kim | 349/141 |
| 2007/0262312 | A1* | 11/2007 | Liu et al. | 257/72 |
| 2008/0241429 | A1 | 10/2008 | Chen et al. | |
| 2010/0059752 | A1* | 3/2010 | Lee et al. | 257/59 |

FOREIGN PATENT DOCUMENTS

| | | |
|---|---|---|
| TW | 200609578 | 3/2006 |
| TW | 200743219 | 11/2007 |
| TW | 200839319 | 10/2008 |

OTHER PUBLICATIONS

"Third Office Action of China counterpart application" issued on Sep. 28, 2012, p. 1-p. 4.
"Office Action of Taiwan counterpart application" issued on Jan. 29, 2013, p. 1-p. 13, in which the listed references (TW200743219, TW200609578, and TW200839319) were cited.

\* cited by examiner

*Primary Examiner* — Stephen W Smoot
(74) *Attorney, Agent, or Firm* — Jianq Chyun IP Office

(57) ABSTRACT

A pixel structure including an active device, a capacitor electrode line, a light shielding layer, a color filter pattern and a pixel electrode is provided. The active device and the capacitor electrode line are disposed on a substrate. The light shielding layer is disposed on the substrate, and the dielectric constant of the light shielding layer is less than 6. The light shielding layer defines a unit area on the substrate, and a contact hole is formed in the light shielding layer above the active device. A color filter pattern is disposed in the unit area, wherein the dielectric constant of the color filter pattern is less than 6, and the color filter pattern does not fill into the contact hole. The pixel electrode is disposed on the color filter pattern, in which the pixel electrode fills into the contact hole so as to electrically connect with the active device.

11 Claims, 31 Drawing Sheets

PIXEL STRUCTURE HAVING PIXEL ELECTRODE DISPOSED ON COLOR FILTER PATTERN AND ELECTRICALLY CONNECTED TO UNDERLYING ACTIVE DEVICE

CROSS-REFERENCE TO RELATED APPLICATION

This application is a Divisional of and claims the priority benefit of U.S. patent application Ser. No. 12/721,571, filed on Mar. 11, 2011, now issued as U.S. Pat. No. 8,283,197, which claims the priority benefits of Taiwan application Serial No. 98126229, filed on Aug. 4, 2009. The entirety of the above-mentioned patent applications is hereby incorporated by reference herein and made a part of specification.

BACKGROUND OF THE INVENTION

1. Field of the Invention

The invention is generally related to a method for fabricating a pixel structure. More particularly, the invention relates to a method for fabricating a pixel structure having a color filter layer by using ink-jet printing for a color filter layer on thin film transistor array (COA).

2. Description of Related Art

With advantages of high definition, small volume, light weight, low driving voltage, low power consumption, and a wide range of applications, a liquid crystal display (LCD) has replaced a cathode ray tube (CRT) display and has become the mainstream display product in the next generation. A conventional LCD panel is formed by a color filter substrate having a color filter layer, a thin film transistor (TFT) array substrate, and a liquid crystal layer sandwiched between the color filter substrate and the TFT array substrate. In order to enhance the resolution of the panel and the aperture ratio of the pixel and to avoid an aligning error when the color filter substrate is bonded with the TFT array substrate, a technique of a color filter layer on TFT array (hence, color filter on array, COA) is provided nowadays.

Currently, a fabrication method for COA includes first forming an active device and a capacitor electrode line on the substrate, and thereafter forming a first passivation layer covering the active device and the capacitor electrode line. Next, after forming a light shielding layer and the color filter layer, a second passivation layer is formed covering the light shielding layer and the color filter layer. Thereafter, by performing a photolithographic process and an etching process, a contact hole exposing the active device as well as a hole corresponding to the capacitor electrode line is defined, and then afterwards a pixel electrode is formed.

Therefore, since the current fabrication method for COA requires many fabrication processes, there is still room for improvement.

Moreover, in order to further reduce costs for the next generation of LCD panels, in addition to COA, a lower cost ink-jet printing process is utilized to replace older fabrication methods of the color filter layer. However, in order to use the ink-jet printing process to fabricate the color filter layer, the light shielding layer is formed in the contact hole of the pixel structure and the surrounding area corresponding to the capacitor electrode line, thereby preventing ink flow thereto from the ink-jet printing process. However, forming the light shielding layer at the locations described above leads to a decrease in the aperture ratio of the pixel structure.

SUMMARY OF THE INVENTION

Accordingly, aspects of the invention provide a pixel structure and a method for fabricating a pixel structure, whereby the aperture ratio of the pixel structure can be increased.

Aspects of the invention provide a method for fabricating a pixel structure, whereby the fabrication process is simplified and manufacturing costs are reduced.

In order to achieve the above or other objects, aspects of the invention provide a method for fabricating a pixel structure. First, a substrate having an active device and a capacitor electrode line formed thereon is provided. Next, a passivation layer is formed on the substrate covering the active device. Thereafter, a light shielding layer is formed on the passivation layer to define a unit area, in which the light shielding layer does not covers the capacitor electrode line within the unit area. Next, an ink-jet printing process is performed to form a color filter pattern within the unit area defined by the light shielding layer. Subsequently, a portion of the color filter pattern is removed to form a first hole in the color filter pattern above the active device. Thereafter, the passivation layer exposed by the first hole is removed, to form a contact hole. Next, a pixel electrode is formed on the color filter pattern, and the pixel electrode fills into the contact hole so as to electrically connect with the active device.

Aspects of the invention provide a pixel structure including an active device, a capacitor electrode line, a passivation layer, a light shielding layer, a color filter pattern, and a pixel electrode. The active device and the capacitor electrode line are disposed on the substrate, and the passivation layer covers the active device. The light shielding layer is disposed on the passivation layer to define a unit area, and the light shielding layer does not cover the capacitor electrode line within the unit. The color filter pattern is disposed in the unit area defined by the light shielding layer, the color filter pattern above the active device has a first hole, and the passivation layer under the first hole has a contact hole. The pixel electrode is disposed on the color filter pattern, and the pixel electrode electrically connects with the active device through the contact hole.

Aspects of the invention provide a method for fabricating a pixel structure, including first providing a substrate having an active device and a capacitor electrode line formed thereon. Next, the passivation layer is formed, whereby the substrate and the capacitor electrode line are covered. Thereafter, a light shielding layer is formed on the passivation layer. Subsequently, the light shielding layer is patterned to define a unit area, and a first hole is formed in the light shielding layer above the active device, whereby the passivation layer is exposed. In the unit area except where the first hole is disposed, a thin light shielding layer covers the unit area. Thereafter, the passivation layer exposed by the first hole is removed so as to form a contact hole, and the light shielding thin layer is removed. Next, an ink-jet printing process is performed to form a color filter pattern in the unit area, in which the color filter pattern does not fill into the contact hole. Thereafter, a pixel electrode is formed on the color filter pattern, and the pixel electrode fills into the contact hole so as to electrically connect with the active device.

Aspects of the invention provide a method for fabricating a pixel structure, including first providing a substrate having an active device and a capacitor electrode line formed thereon. Next, a light shielding layer is formed on the substrate, in which the dielectric constant of the light shielding layer is less than 6. Thereafter, the light shielding layer is patterned to define a unit area, and a contact hole is formed in the light shielding layer above the active device, so as to expose the active device. Subsequently, an ink-jet printing process is performed to form a color filter pattern in the unit area, in which the dielectric constant of the color filter pattern is less than 6, and the color filter pattern does not fill into the contact hole. Thereafter, a pixel electrode is formed on the color filter pattern, and the pixel electrode fills into the contact hole so as to electrically connect with the active device.

Aspects of the invention provide a pixel structure including an active device, a capacitor electrode line, a light shielding layer, a color filter pattern, and a pixel electrode. The active device and the capacitor electrode line are disposed on a substrate. The light shielding layer is disposed on the substrate, and the dielectric constant of the light shielding layer is less than 6. The light shielding layer defines a unit area on the substrate, and a contact hole is formed in the light shielding layer above the active device. A color filter pattern is disposed in the unit area, in which the dielectric constant of the color filter pattern is less than 6, and the color filter pattern does not fill into the contact hole. The pixel electrode is disposed on the color filter pattern, in which the pixel electrode fills into the contact hole so as to electrically connect with the active device.

In summary, compared with conventional fabrication methods of the pixel structure, the method for fabricating the pixel structure according to aspects of the invention can omit forming the light shielding layer at the contact hole, thereby increasing the aperture ratio. Moreover, aspects of the invention provide the method for fabricating the pixel structure, whereby usage of the passivation layer and the buffer layer are reduced, thus simplifying the fabrication process and reducing costs.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1J' is a partially expanded schematic view of a drain.

DESCRIPTION OF EMBODIMENTS

First Embodiment

Figure 1A:
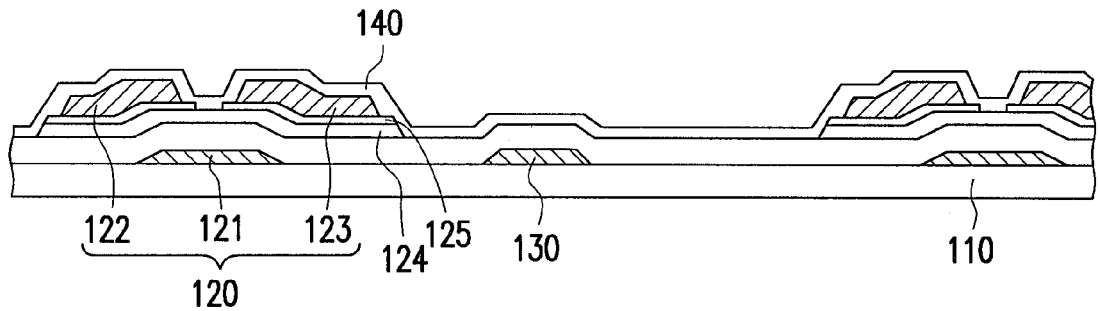
FIGS. 1A to 1I are schematic views illustrating the steps for fabricating a pixel structure in accordance with a first embodiment of the invention.

FIGS. 1A to 1I are schematic views illustrating the steps for fabricating a pixel structure in accordance with a first embodiment of the invention. Referring to FIG. 1A, a substrate 110 is provided. A material of the substrate 110 includes glass, plastic, and other solid or soft materials, for example. An active device 120 and a capacitor electrode line 130 are already formed on the substrate 110. The active device 120 is a TFT, for example, and the active device 120 includes a gate 121, a source 122, a drain 123, a semiconductor layer 124, and an ohmic contact layer 125. The active device 120 is electrically connected with a scan line and a data line (not shown). Moreover, the capacitor electrode line 130 is arranged parallel to the scan line.

After forming the active device 120 and the capacitor electrode line 130, a passivation layer 140 covering the active device 120 is formed on the substrate 110. A material of the passivation layer 140 can include an organic dielectric material such as acrylic resin and photosensitive resin, or an inorganic dielectric material such as silicon oxide, silicon nitride or silicon-oxy-nitride. More specifically, a spin coating process is typically performed to form the passivation layer 140 when an organic dielectric material is selected for the passivation layer 140. On the other hand, when an inorganic material is selected for the passivation layer 140, a physical vapor deposition process or a chemical vapor deposition process is performed for total deposition of the passivation layer 140 on the substrate 110.

Figure 1B:
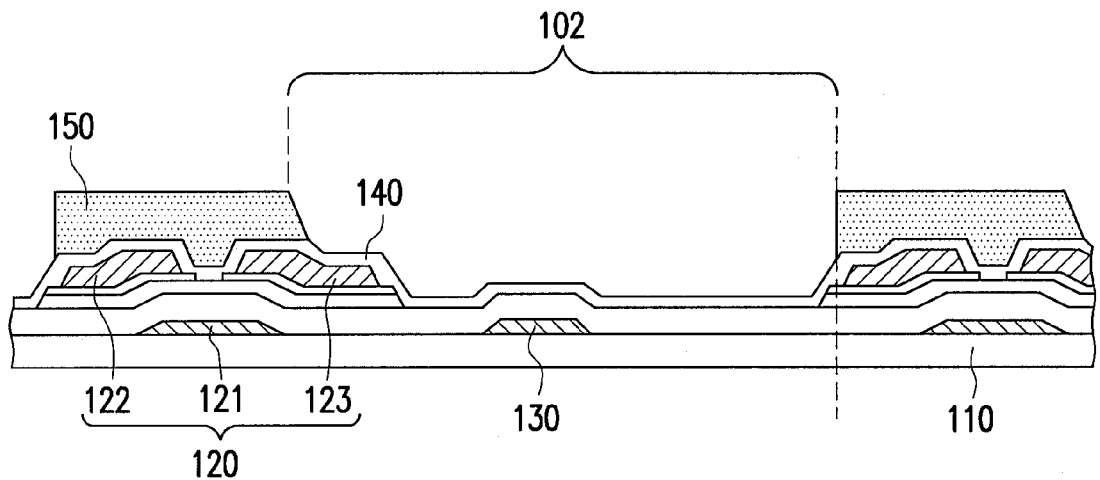

Thereafter, referring to FIG. 1B, a light shielding layer 150 is formed on the passivation layer 140 to define a unit area 102. A material of the light shielding layer 150 includes black resin, metal, a stack of multiple color filter layers such as a stack of red, green, and blue color filters, or other materials capable of achieving a light shielding effect. More specifically, the light shielding layer 150 is formed, for example, by first forming a light shielding material layer on the passivation layer 140, and thereafter patterning the light shielding material layer. The light shielding material layer is formed, for example, by spin-coating, slit/spin coating, or spin-less coating the light shielding material layer on the passivation layer 140. The processes for patterning the light shielding material layer include soft baking, exposure, development, and hard baking.

Figure 1C:
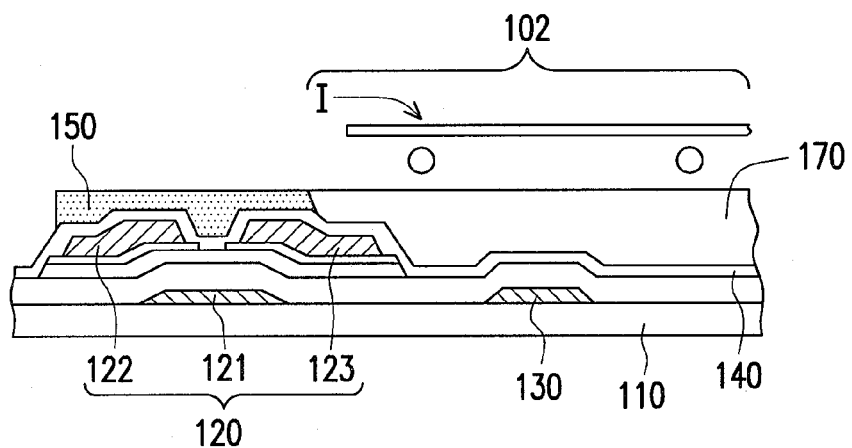

FIGS. 1C-1I illustrates the structure in a unit area 102. Referring to FIG. 1C, a color filter pattern 170 is formed in the unit area 102 by an ink-jet printing process I. In the present embodiment of the invention, the color filter pattern 170 is a negative photoresist material, for example. Therefore, the exposed portion of the photoresist material is not removed by the later development process, whereas the masked portion of the photoresist material is removed. The color filter pattern 170 can be a red, green, blue color filter pattern, or a filter pattern of other colors.

Figure 1D:
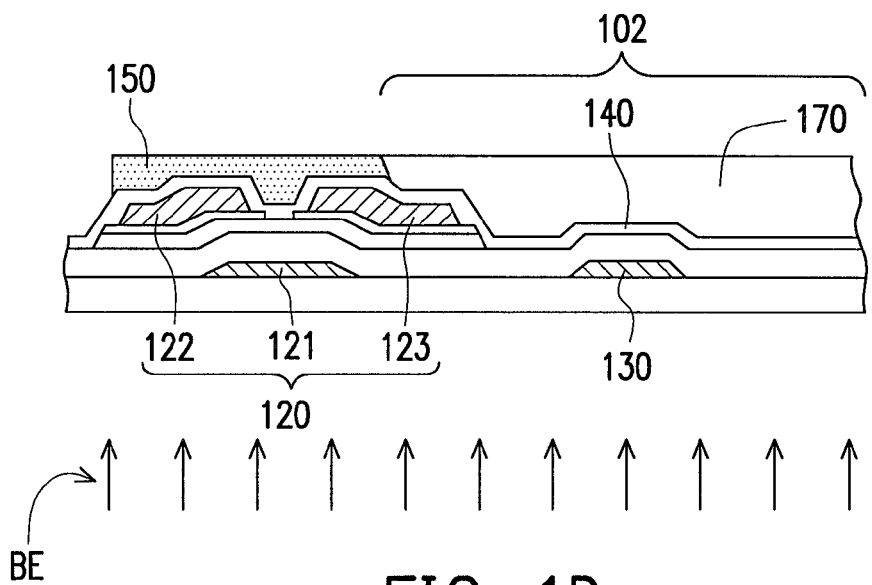

Next, referring to FIG. 1D, a backside exposure process BE is performed from the backside of the substrate 110 toward the color filter pattern 170. The backside exposure process BE uses the active device 120 and the capacitor electrode line 130 as an exposure mask.

Figure 1E:
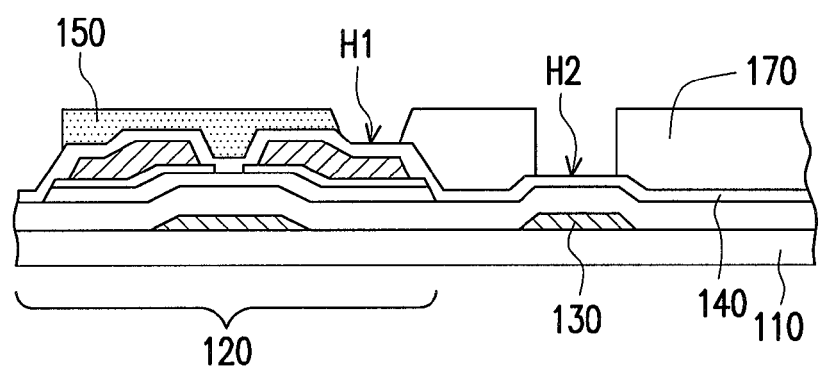

Next, referring to FIG. 1E, the development process is performed to remove a portion of the color filter pattern 170. In other words, the unexposed area of the color filter pattern 170 in the aforementioned step of FIG. 1D is removed at this time. Consequently, a first hole H1 is formed in the color filter pattern 170 above the active device 120. Moreover, a second hole H2 is formed in the color filter pattern 170 above the capacitor electrode line 130.

Figure 1F:
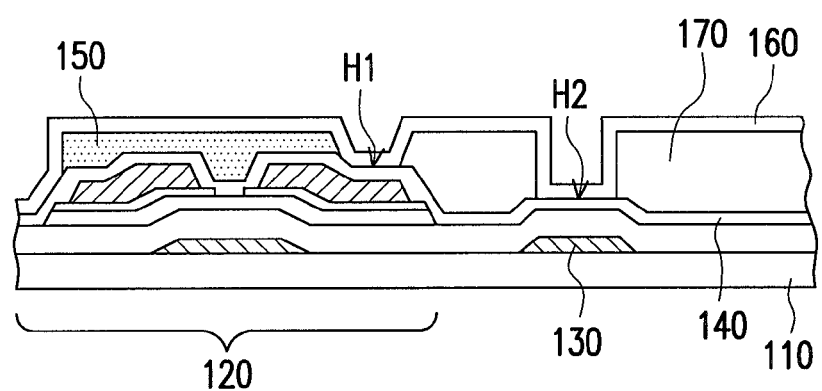

Next, referring to FIG. 1F, a buffer layer 160 is formed. The buffer layer 160 covers the light shielding layer 150 and the color filter pattern 170. A material of the buffer layer can include acrylic resin, photosensitive resin, and other organic dielectric materials. The buffer layer 160 can be formed by spin coating. The buffer layer can also be formed with inorganic dielectric materials. An example can be using chemical vapor deposition (CVD) or other suitable thin film deposition techniques of dielectric materials such as silicon oxide, silicon nitride or silicon-oxy-nitride.

Figure 1G:
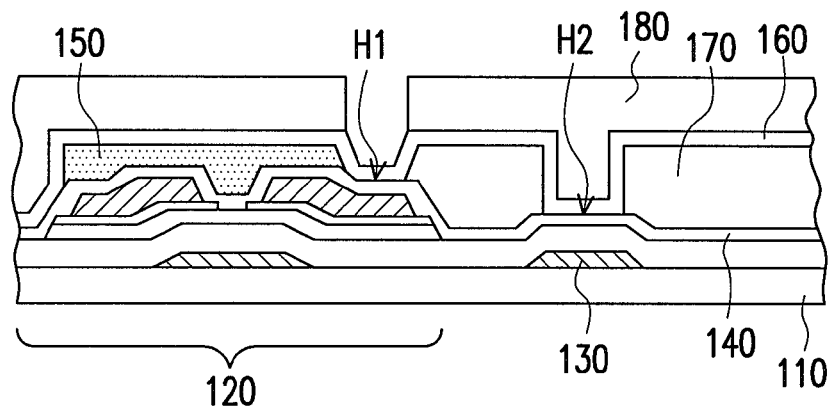
Figure 1H:
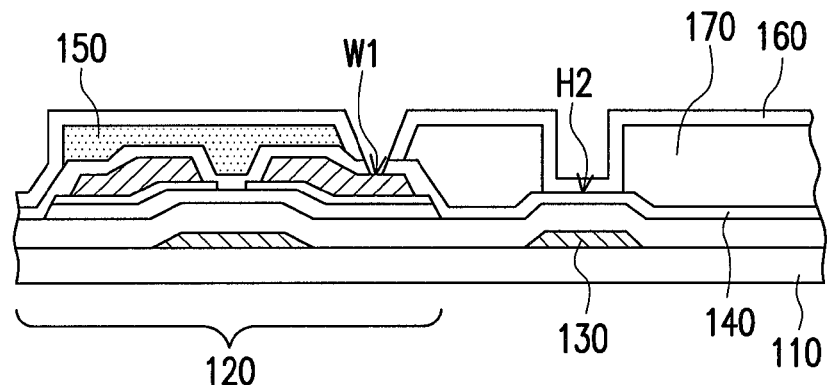

Next, referring to FIG. 1G, a patterned photoresist layer 180 is formed on the buffer layer 160, whereby the buffer layer 160 above the first hole H1 is exposed. Thereafter, as shown in FIG. 1H, using the patterned photoresist layer 180 as a mask, the exposed portions of the buffer layer 160 and the passivation layer 140 under the buffer layer 160 are removed, whereby a contact hole W1 is formed. The contact hole W1 exposes a portion of the active device 120. Thereafter, the patterned photoresist layer 180 is removed.

Figure 1I:
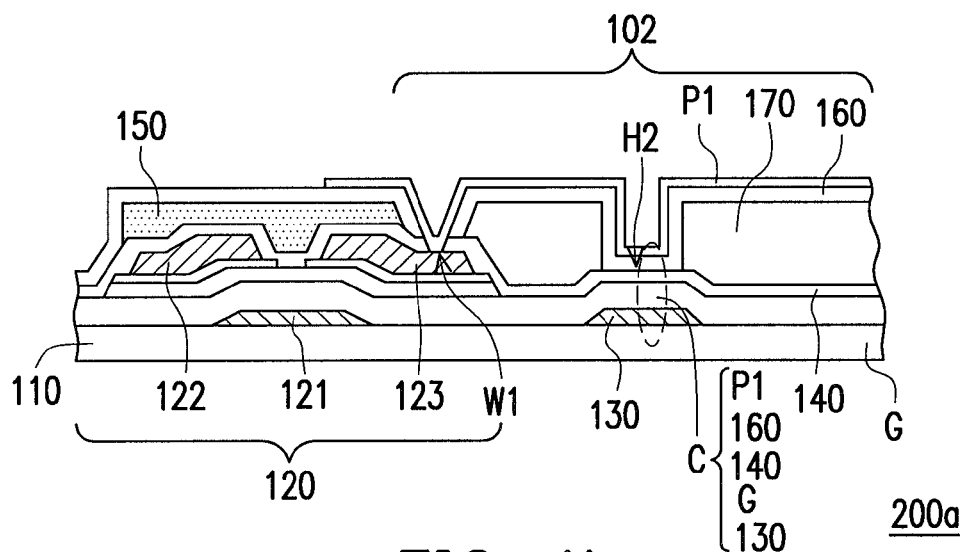

Next, referring to FIG. 1I, a pixel electrode P1 is formed on the color filter pattern 170. The pixel electrode P1 fills into the first contact hole W1 so as to electrically connect with the active device 120. By filling into the second hole H2, the pixel electrode P1 forms a storage capacitor C with the capacitor electrode line 130. The storage capacitor C is formed by the capacitor electrode line 130, the pixel electrode P1, and a capacitor dielectric layer sandwiched between the capacitor electrode line 130 and the pixel electrode P1, in which the capacitor dielectric layer is comprised of the buffer layer 160, the passivation layer 140, and the gate insulating layer G.

A pixel structure 200a is fabricated by following the aforementioned steps depicted in FIGS. 1A-1I. It should be mentioned that according to another embodiment of the invention, when fabricating the pixel structure with the backside exposure process, a drain 123 can be designed specifically. The description hereinbelow uses drawings for aid.

Figure 1J:
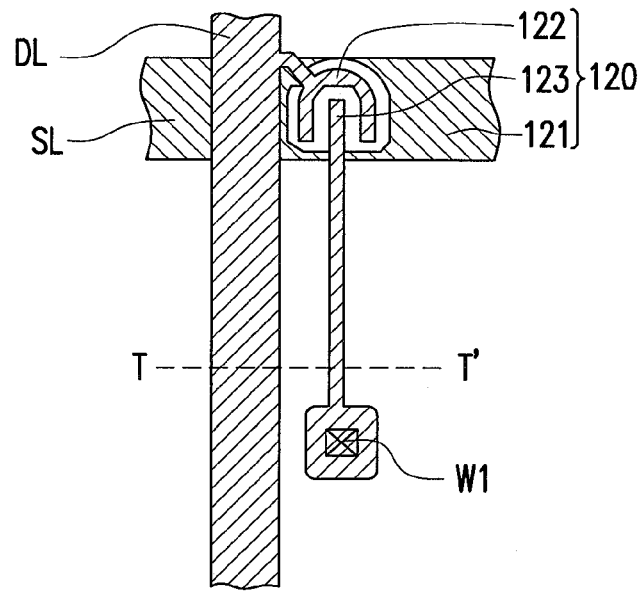
FIG. 1J is a partial top view of the pixel structure in accordance with the first embodiment of the invention.
Figure 1J:
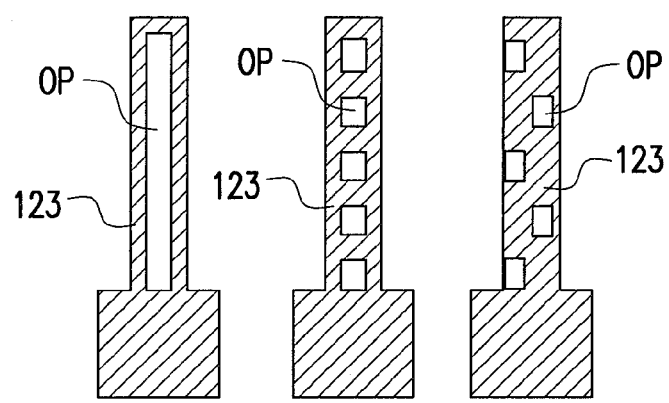
Figure 1K:
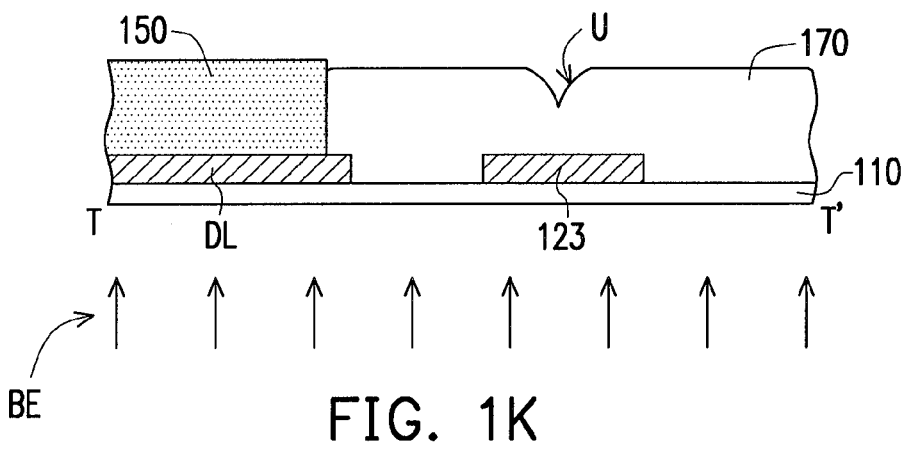
FIG. 1K is a cross-sectional schematic view corresponding to T-T' of FIG. 1J illustrating a backside exposure process BE patterning a color filter pattern 170.

FIG. 1J is a partial top view illustrating a pixel structure in accordance with the first embodiment of the invention. FIG. 1J' is a partially enlarged schematic view of a drain. Referring to FIGS. 1I and 1J concurrently, in the pixel structure 200a of the first embodiment, the active device 120 includes a gate 121, a source 122, and a drain 123. Herein, the gate 121 is a part of a scan line SL, whereas the source 122 is electrically connected with a data line DL. As shown in FIG. 1J', the contact hole W1 exposes the drain 123, and the drain 123 includes a plurality of hole patterns OP. Three different designs for the hole patterns OP of the drain 123 are depicted in FIG. 1J'. In practice, different types of hole patterns OP can be designed according to various needs. As shown in FIG. 1K, it should be noted that a reason for fabricating the hole patterns OP in the drain 123 is because while backside exposing the color filter pattern 170 for patterning, if a specific region of the drain 123 has a narrow design, the optical proximity effect causes a trench U to form in the color filter pattern 170 above the drain 123, whereby incomplete exposure results. FIG. 1K is a schematic cross-sectional view corresponding to T-T' of FIG. 1J for the backside exposure process BE patterning the color filter pattern 170. Therefore, by designing multiple hole patterns OP in the drain 123 according to the present embodiment of the invention, the formation of the trench U can be avoided during the backside exposure process BE and the development process, thereby the backside exposure can be successfully completed.

Moreover, the storage capacitor C of the above-described first embodiment is a metal/insulator/ITO (MII) type storage capacitor. However, the storage capacitor in the pixel structure can be other types, such as metal/insulator/metal (MIM), although the invention is not limited thereto.

Figure 2A:
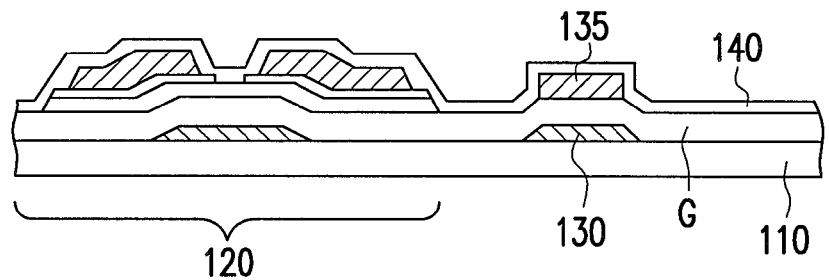
FIGS. 2A-2D are schematic views illustrating the steps for fabricating a pixel structure having a metal/insulator/metal structure storage capacitor in accordance with the first embodiment of the invention.

When the storage capacitor C has a MIM structure, the fabrication process thereof is similar to the pixel structure of the above-described first embodiment, with differences is shown in FIG. 2A, before forming the passivation layer 140, an upper electrode pattern 135 is disposed above the capacitor electrode line 130.

Figure 2B:
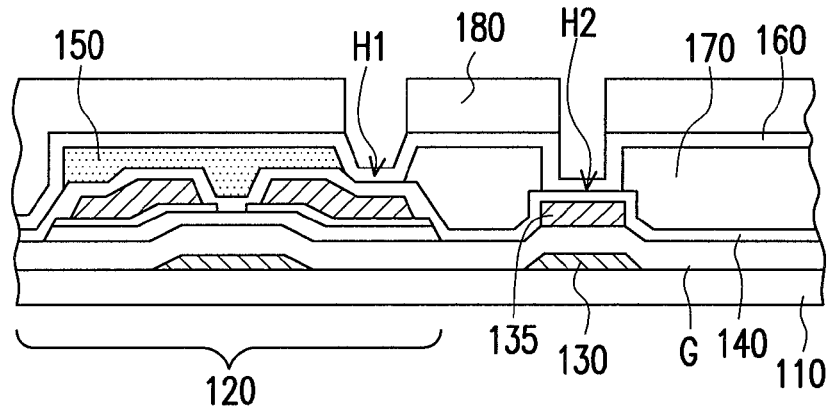

Next, referring to FIG. 2B after completing the same steps depicted in FIGS. 1B-1F, while forming the patterned photoresist layer 180, the buffer layer 160 above the first hole H1 and the second hole H2 are exposed.

Figure 2C:
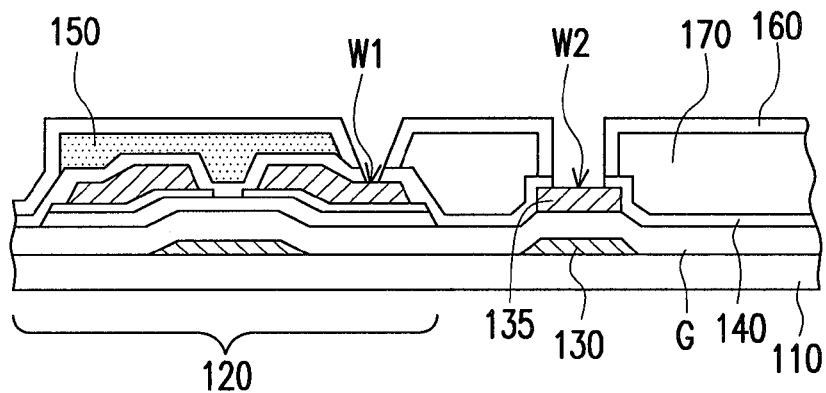

Thereafter, as shown in FIG. 2C, using the patterned photoresist layer 180 as a mask, the exposed portion of the buffer layer 160 and the passivation layer 140 under the buffer layer 160 are removed, whereby a first contact hole W1 and a second contact hole W2 are formed. The first contact hole W1 exposes a portion of the active device 120, while the second contact hole W2 exposes a portion of the upper electrode pattern 135.

Figure 2D:
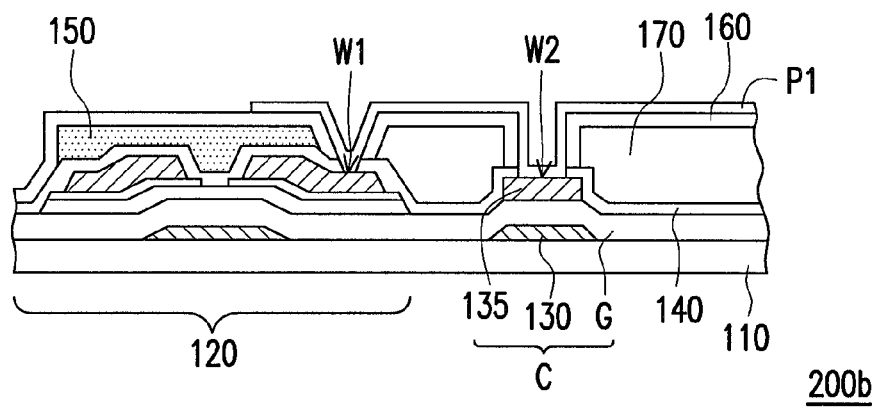

Next, referring to FIG. 2D, the pixel electrode P1 is formed on the color filter pattern 170 and the buffer layer 160. The pixel electrode P1 fills into the first contact hole W1 so as to electrically connect with the active device 120. The pixel electrode P1 fills into the second contact hole W2 so as to electrically connect with the upper electrode pattern 135. Therefore, the capacitor electrode line 130, the gate insulating layer G, and the upper electrode pattern 135 form the storage capacitor C. By completing the above-described steps, a pixel structure 200b having a MIM structure storage capacitor C can be fabricated.

In other embodiments of the invention, for the foregoing steps depicted in FIGS. 2B-2D, the first hole H1 or the second hole H2 can be omitted, or the formation of the first contact hole W1 or the second contact hole W2 can be omitted. In other words, only the first contact hole W1 or the second contact hole W2 is formed, in which the drain of the active device 120 is connected with the upper electrode pattern 135. Therefore, the upper electrode pattern 135 can be viewed as a part of the drain of the active device 120. Consequently, after forming the pixel electrode P1 (as shown in FIG. 2D), the pixel electrode P1 can be electrically connected with the drain of the active device 120 and the upper electrode pattern 135 through the first contact hole W1 or the second contact hole W2.

Moreover, it should be noted that in the above-described embodiments, forming the buffer layer 160 on the color filter pattern 170 is only an example for description, and the invention is not limited thereto. In other embodiments of the invention, a buffer layer can be omitted. In other words, after forming the color filter pattern 170, the holes H1-H2, and the contact holes W1-W2, the pixel electrode P1 is formed on the surface of the color filter pattern 170.

Second Embodiment

Figure 3A:
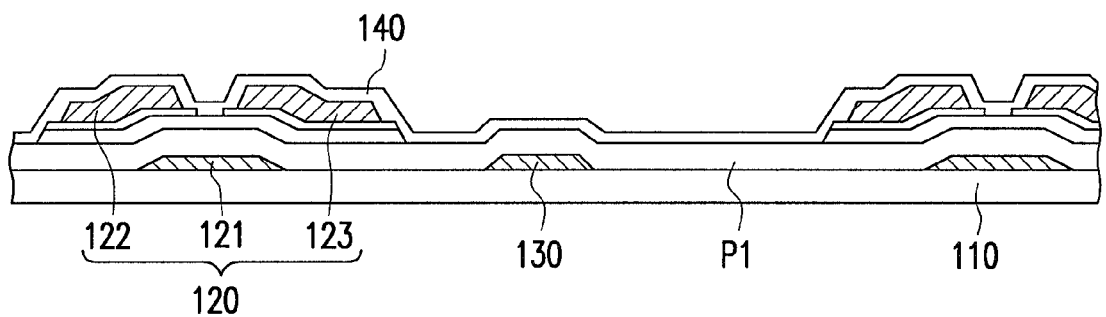
FIGS. 3A-3G are schematic views illustrating the steps for fabricating a pixel structure in accordance with a second embodiment of the invention.
Figure 3B:
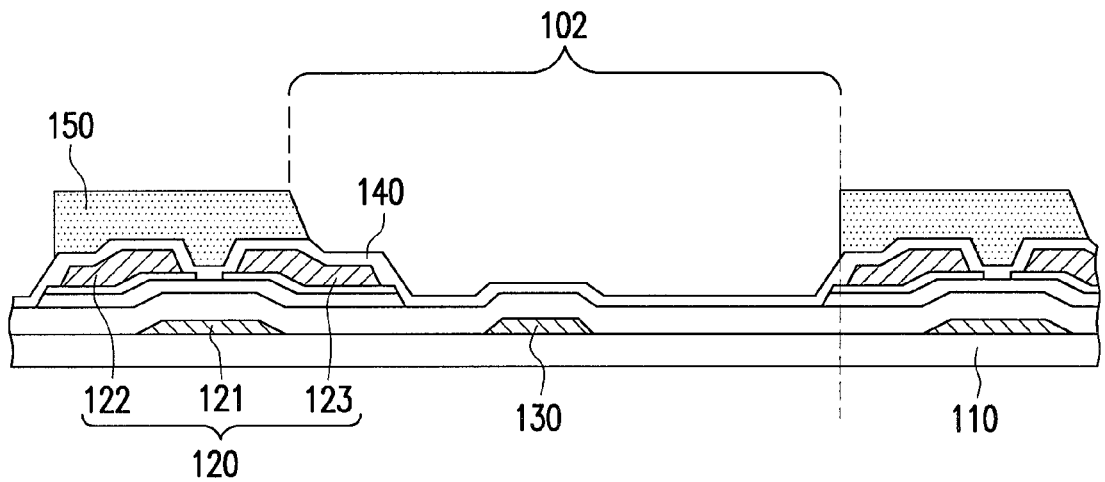
Figure 3C:
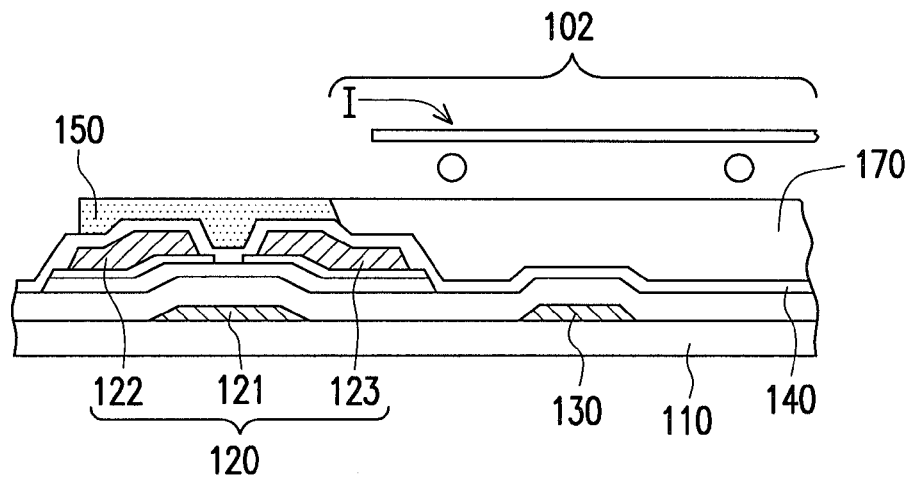

FIGS. 3A-3G are schematic views illustrating the steps for fabricating a pixel structure in accordance with a second embodiment of the invention. The steps depicted in FIGS. 3A-3C are the same as the fabrication method depicted in FIGS. 1A-1C from the first embodiment of the invention. Therefore, no further description thereof is included herein.

Figure 3D:
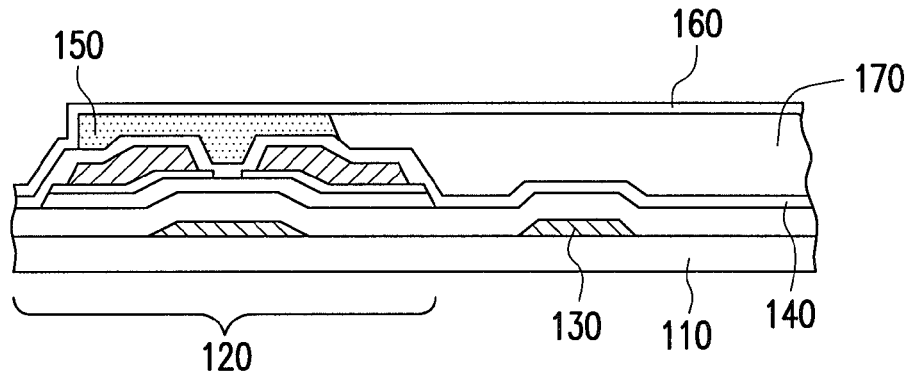

Referring to FIG. 3D, after forming the color filter pattern 170, the buffer layer 160 is formed, and the buffer layer 160 covers the light shielding layer 150 and the color filter pattern 170.

Figure 3E:
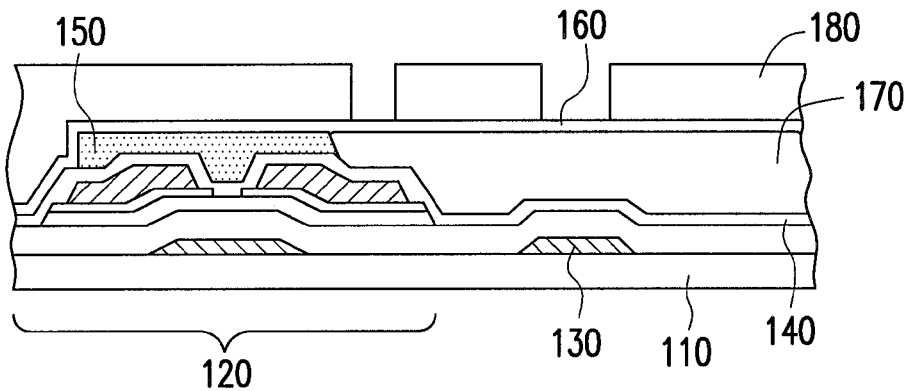

Next, referring to FIG. 3E, the patterned photoresist layer 180 is formed on the buffer layer 160, whereby a portion of the buffer layer 160 is exposed.

Figure 3F:
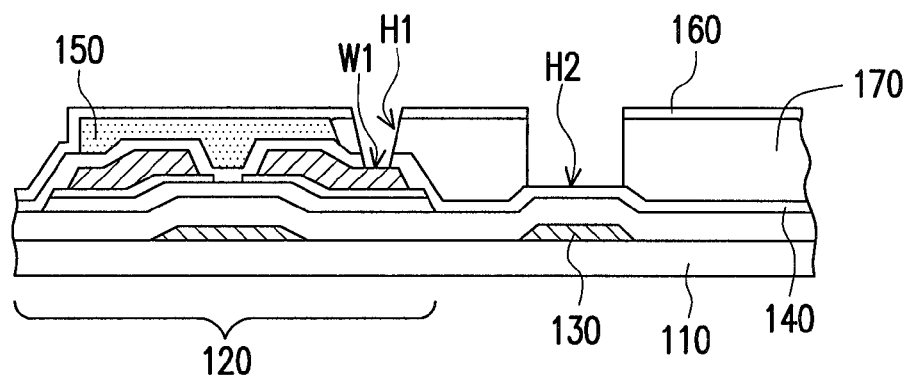

Thereafter, referring to FIG. 3E, by using the patterned photoresist layer 180 as a mask, the exposed portion of the buffer layer 160, the color filter pattern 170, and the passivation layer 140 are removed by a dry etching process, for example, so as to form a first hole H1 and a second hole H2 in the color filter pattern 170. As shown in FIG. 3F, the first contact hole W1 is concurrently formed in the passivation layer 140 under the first hole H1, so as to expose a portion of the active device 120. It should be noted that the passivation layer 140 under the second hole H2 can also be removed in the dry etching process. The step depicted in FIG. 3E is only an example, therefore the invention should not be limited thereto.

Figure 3G:
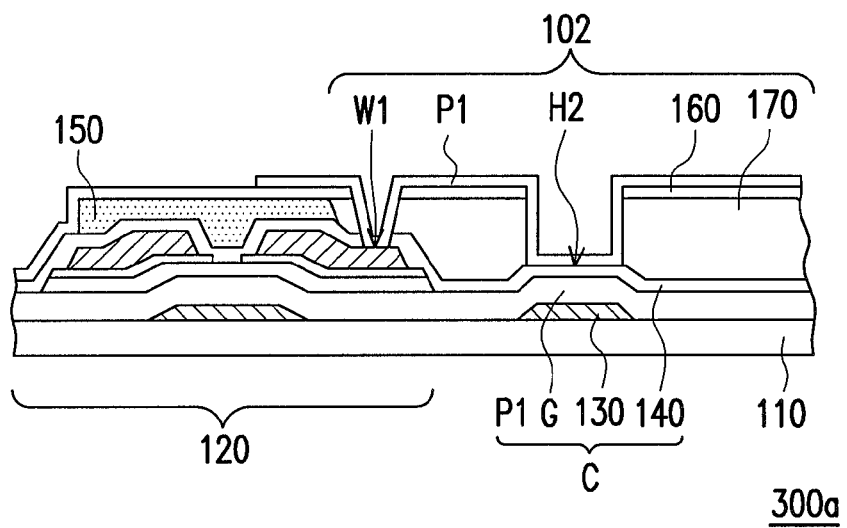

Next, referring to FIG. 3G, the pixel electrode P1 is formed on the color filter pattern 170 and the buffer layer 160. The pixel electrode P1 fills into the first contact hole W1 so as to electrically connect with the active device 120. By filling into the second hole H2, the pixel electrode P1 forms the storage capacitor C with the capacitor electrode line 130. The storage capacitor C includes the pixel electrode P1, the passivation layer 140, the gate insulating layer G, and the capacitor electrode line 130. A pixel structure 300a can be fabricated by following the aforementioned steps depicted in FIGS. 3A-3G.

Figure 4:
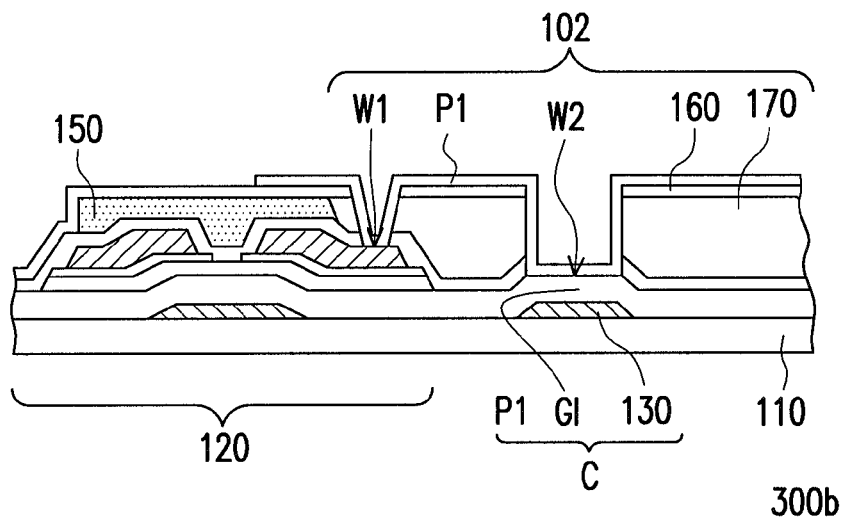
FIG. 4 is a schematic view illustrating the steps for fabricating another pixel structure in accordance with the second embodiment of the invention.

In other embodiments of the invention, as shown in a pixel structure depicted in FIG. 4, the second contact hole W2 can also be formed in the passivation layer 140 under the second hole H2, so as to expose a portion of the gate insulating layer G. At this time, the storage capacitor C includes the pixel electrode P1, the gate insulating layer G, and the capacitor electrode line 130.

Figure 5A:
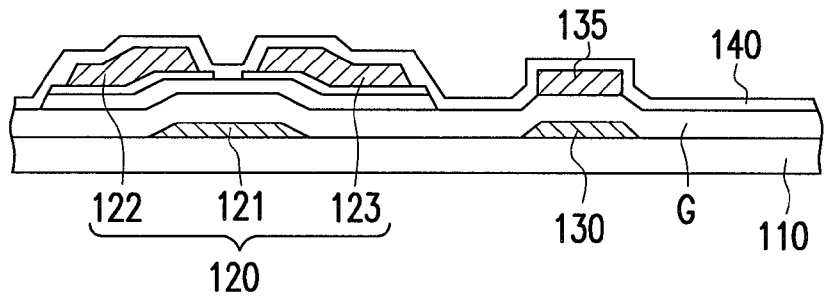
FIGS. 5A-5C are schematic views illustrating the steps for fabricating a pixel structure having a metal/insulator/metal structure storage capacitor in accordance with the second embodiment of the invention.

In the second embodiment of the invention, the above-described storage capacitor C of the pixel structure 300a is a metal/insulator/ITO (MIT) type storage capacitor. Similarly, the present embodiment is suitable for the storage capacitor C having the metal/insulator/metal (MIM) structure. The fabrication method thereof is mostly the same as for the pixel structure 300a, where the differences are shown in FIG. 5A. Before forming the passivation layer 140, the upper electrode pattern 135 is disposed above the capacitor electrode line 130.

Figure 5B:
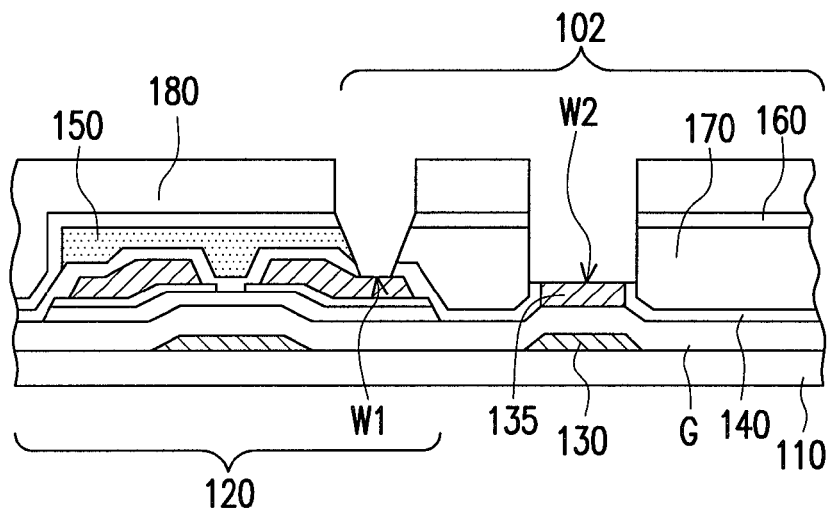

Thereafter, after performing the aforementioned steps depicted in FIGS. 3A-3E, refer to FIG. 5B. Using the patterned photoresist layer 180 as a mask, the exposed portion of the buffer layer 160, the color filter pattern 170 under the buffer layer 160, and the passivation layer 140 are removed, whereby the first contact hole W1 and the second contact hole W2 are formed. The first contact hole W1 exposes a portion of the active device 120, whereas the second contact hole W2 exposes a portion of the upper electrode pattern 135.

Figure 5C:
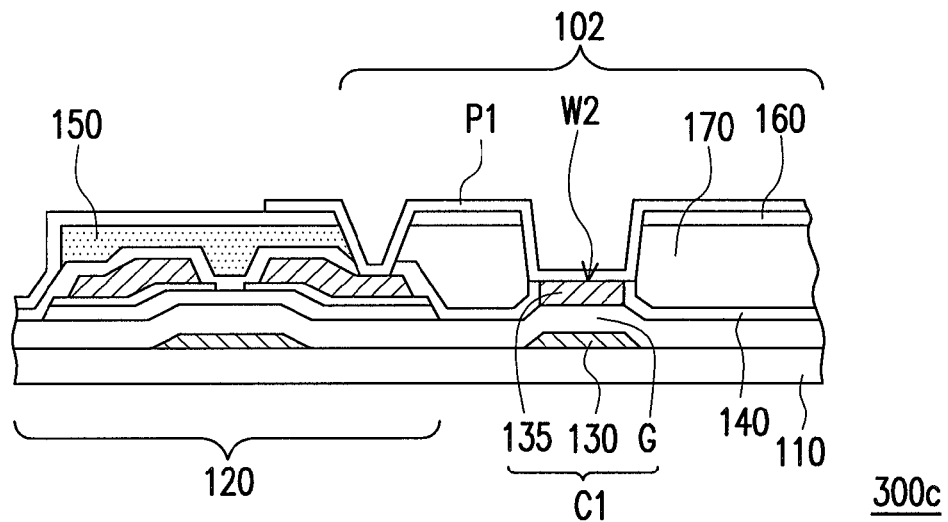

Next, referring to FIG. 5C, the pixel electrode P1 is formed on the color filter pattern 170. The pixel electrode P1 fills into the first contact hole W1 so as to electrically connect with the active device 120. The pixel electrode P1 fills into the second contact hole W2 so as to electrically connect with the upper electrode pattern 135. The capacitor electrode line 130, the gate insulating layer G, and the upper electrode pattern 135 form the storage capacitor C. By completing the above-described steps, a pixel structure 300c having a MIM structure storage capacitor C can be fabricated.

Similarly, in the aforementioned embodiment of the invention, an example of forming the buffer layer 160 on the color filter pattern 170 is used, but the invention is not limited thereto. In other embodiments of the invention, the buffer layer can be omitted. In other words, after forming the color filter pattern 170, the openings H1-H2, and the contact holes W1-W2, the pixel electrode P1 is formed on the surface of the color filter pattern 170.

Figure 6:
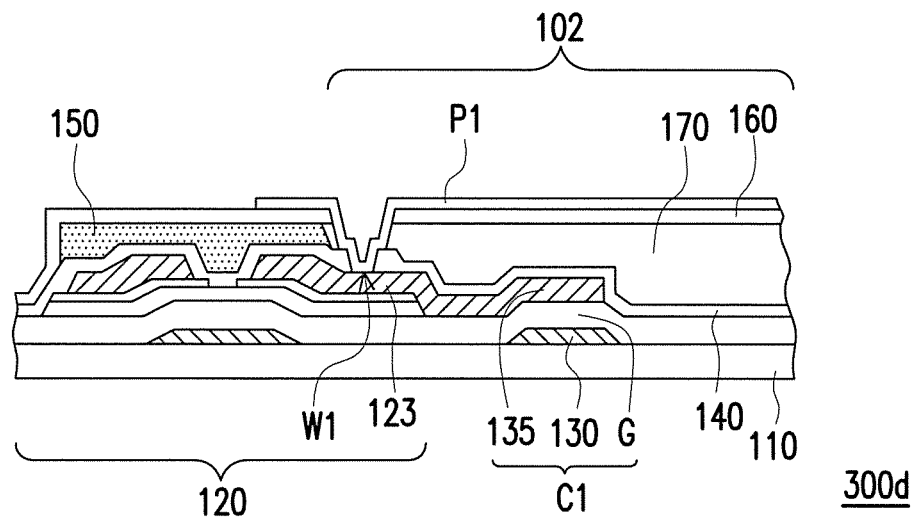
FIG. 6 is a schematic view illustrating the pixel structure having the metal/insulator/metal structure storage capacitor in accordance with the second embodiment of the invention.

In a pixel structure 300d depicted in FIG. 6 according to another embodiment of the invention, through layout design of the pixel structure, the upper electrode pattern 135 and the drain 123 can be connected. In other words, the upper electrode pattern 135 can be viewed as a part of the drain of the active device 120. Consequently, the second contact hole W2 depicted in FIG. 5C can be omitted, and the pixel electrode P1 electrically connects with the drain 123 of the active device 120 (along with the upper electrode pattern 135) through the first contact hole W1.

Figure 7:
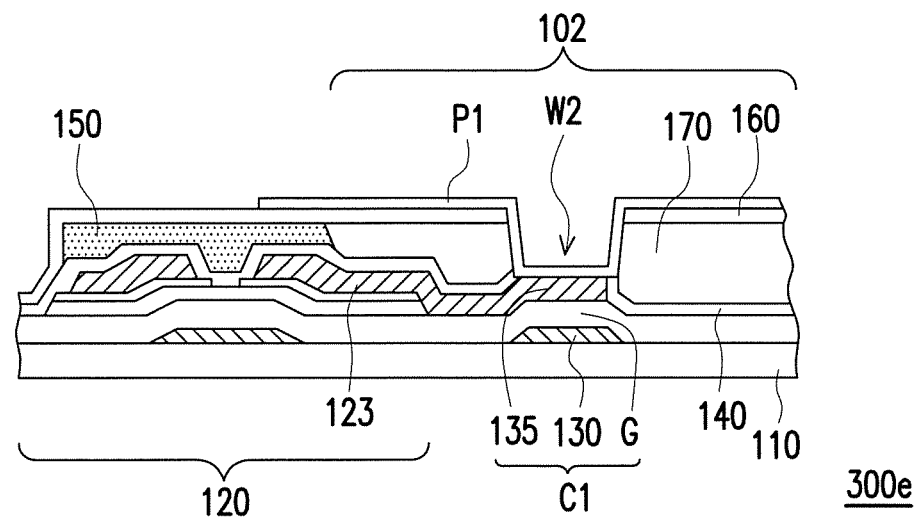
FIG. 7 is a schematic view illustrating the pixel structure having the metal/insulator/metal structure storage capacitor in accordance with the second embodiment of the invention.

In addition, according to an embodiment of the invention depicted in a pixel structure 300e of FIG. 7, the upper electrode pattern 135 is connected with the drain 123. In other words, the upper electrode pattern 135 can be viewed as a part of the drain 123 of the active device 120. Therefore, the pixel electrode P1 electrically connects with the drain 123 of the active device 120 (along with the upper electrode pattern 135) through the second contact hole W2.

Third Embodiment

Figure 8A:
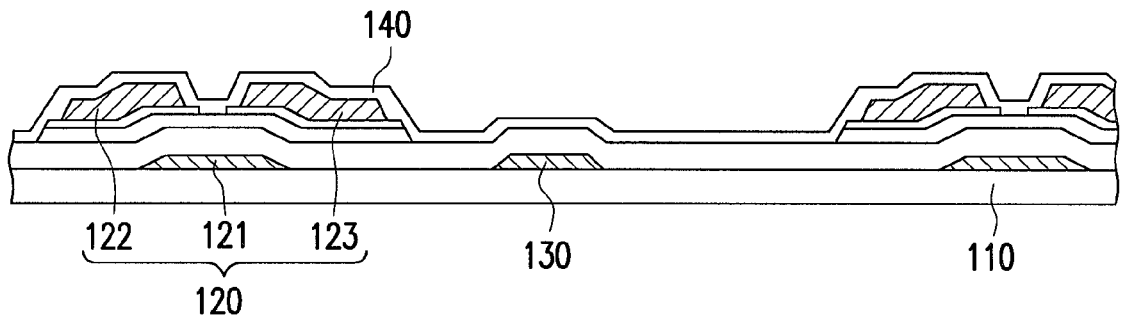
FIGS. 8A-8H are schematic views illustrating the steps for fabricating a pixel structure in accordance with a third embodiment of the invention.
Figure 8B:
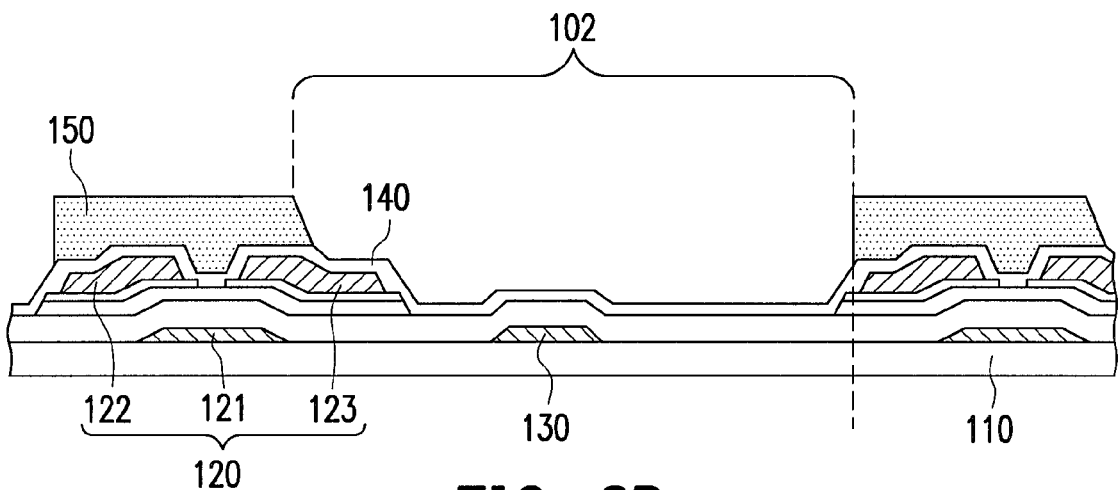
Figure 8C:
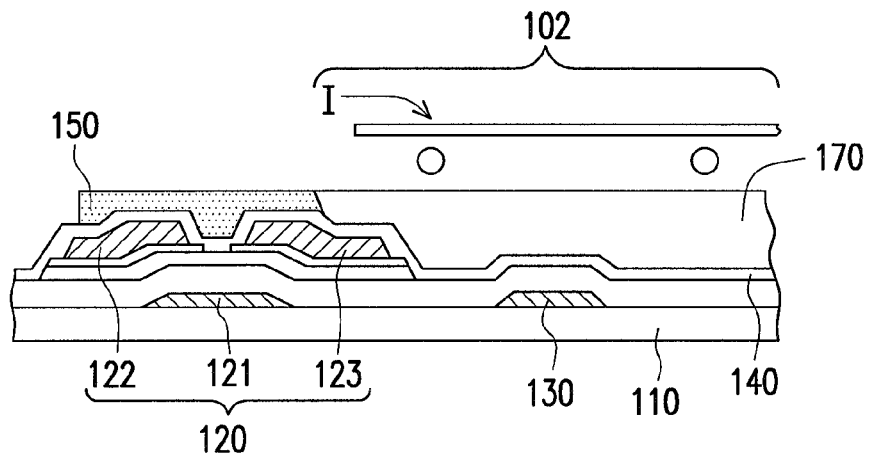

FIGS. 8A-8H are schematic views illustrating the steps for fabricating a pixel structure in accordance with a third embodiment of the invention. The steps depicted in FIGS. 8A-8C are the same as the fabrication method depicted in FIGS. 1A-1C from the first embodiment of the invention. Therefore, no further descriptions thereof are included herein.

Figure 8D:
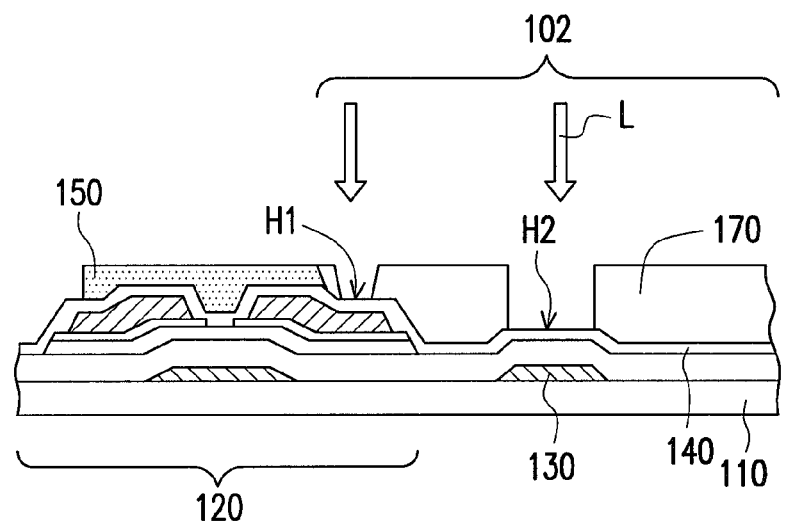

Referring to FIG. 8D of the invention, a laser removal process L is performed for removing a portion of the color filter pattern 170, so as to form the first hole H1 and the second hole H2. The first hole H1 and the second hole H2 exposes a portion of the passivation layer 140. The laser removal process L can use a 248 nm wavelength laser source, for example.

Figure 8E:
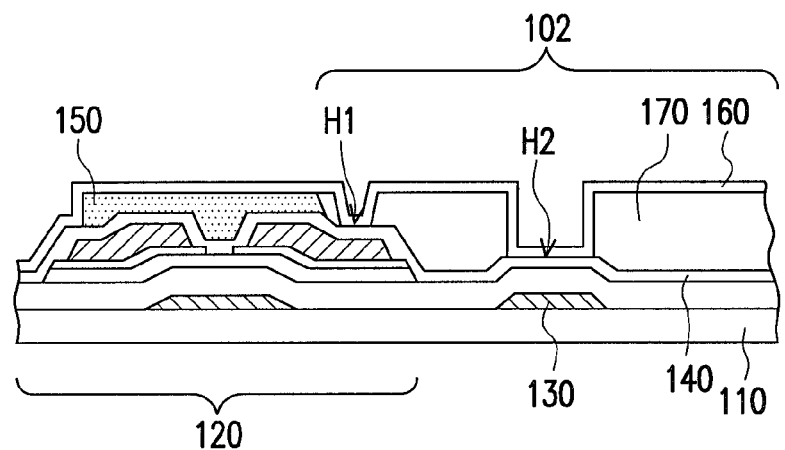

Next, referring to FIG. 8E, the buffer layer 160 is formed, whereby the light shielding layer 150, the color filter pattern 170, and the portion of the passivation layer 140 exposed by the first hole H1 and the second hole H2 are covered.

Figure 8F:
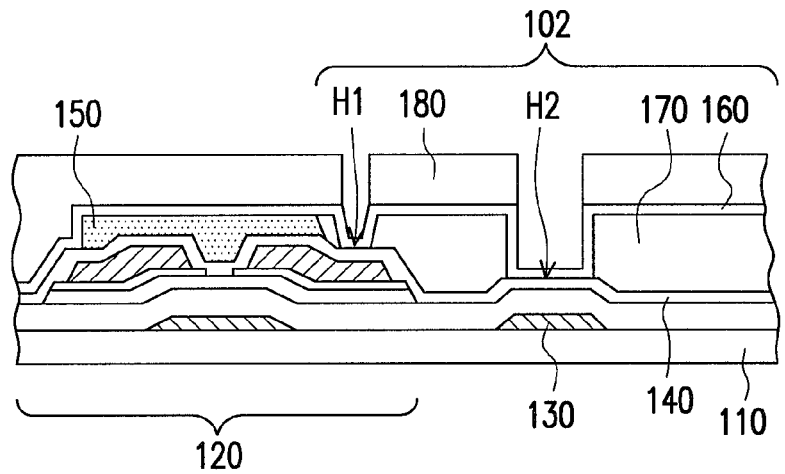

Next, referring to FIG. 8F, the patterned photoresist layer 180 is formed on the buffer layer 160, whereby the buffer layer 160 above the first hole H1 and the second hole H2 is exposed.

Figure 8G:
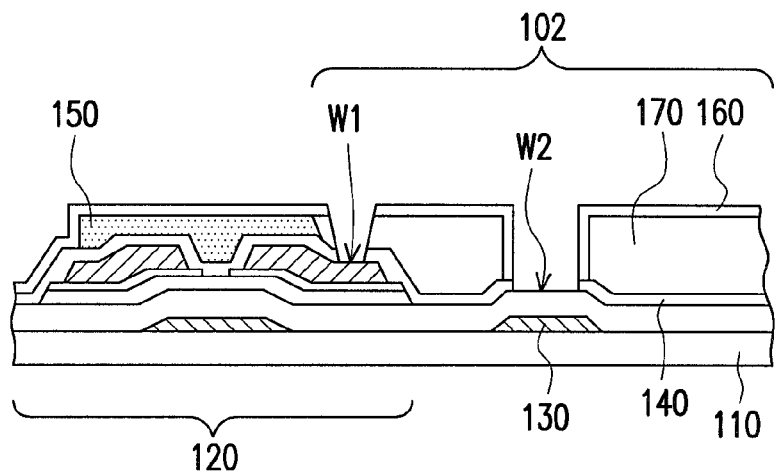

Thereafter, as shown in FIG. 8G, using the patterned photoresist layer 180 depicted in FIG. 8F as a mask, an exposed portions of the buffer layer 160 and the passivation layer 140 under the buffer layer 160 are removed, for example by a dry etching process. Consequently, the first contact hole W1 and the second contact hole W2 are formed.

Figure 8H:
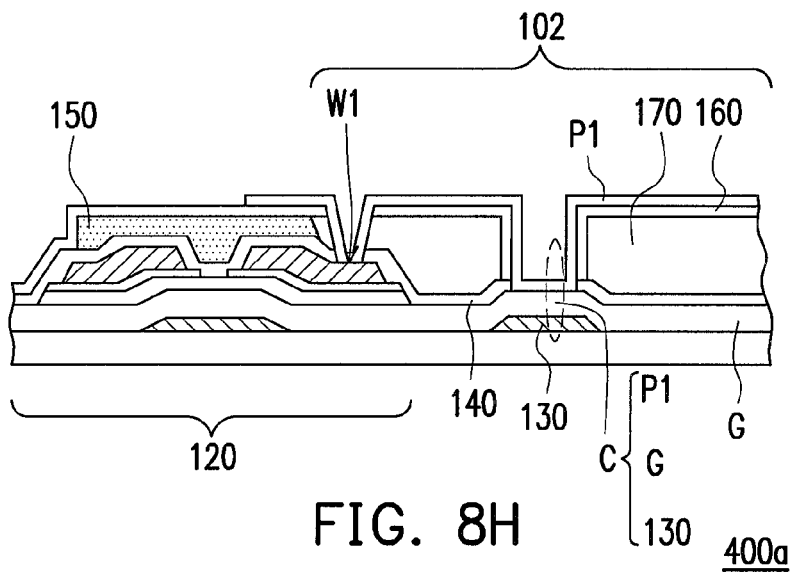

Next, referring to FIG. 8H, the pixel electrode P1 is formed on the color filter pattern 170. The pixel electrode P1 fills into the first contact hole W1 and is electrically connected with the active device 120. By filling into the second contact hole W2, the pixel electrode P1 forms the storage capacitor C with the capacitor electrode line 130. The storage capacitor C includes the pixel electrode P1, the gate insulating layer G, and the capacitor electrode line 130. A pixel structure 400a is fabricated by following the aforementioned steps depicted in FIGS. 8A-8H.

Figure 9A:
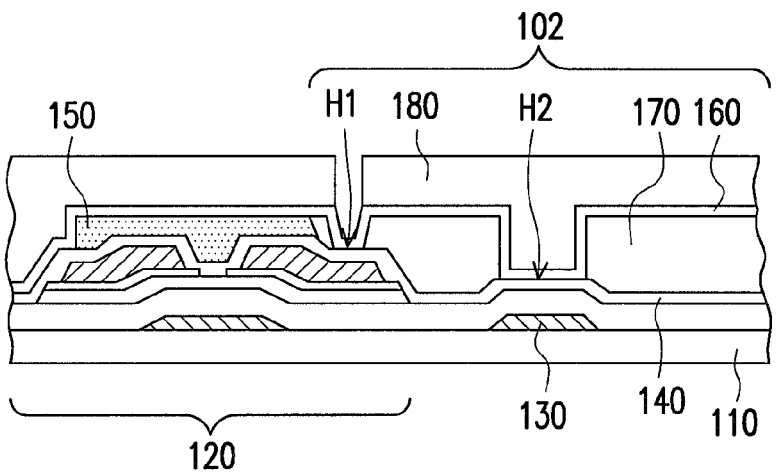
FIGS. 9A-9C are schematic views illustrating the steps for fabricating another pixel structure in accordance with the third embodiment of the invention.
Figure 9B:
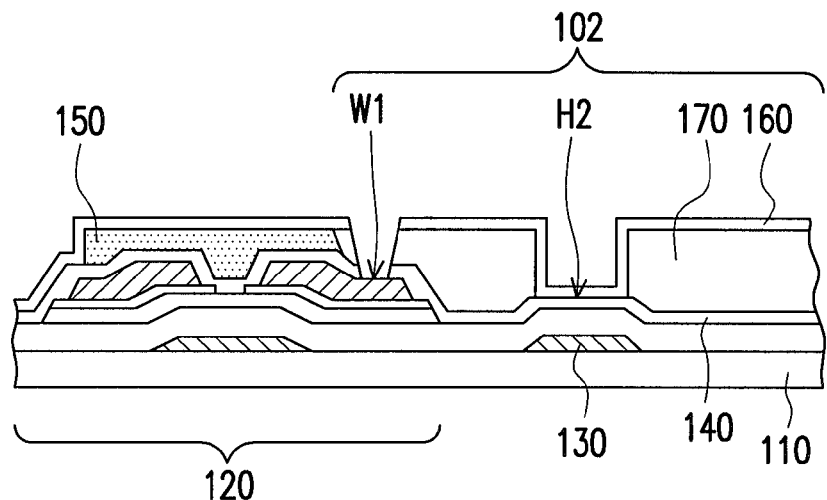
Figure 9C:
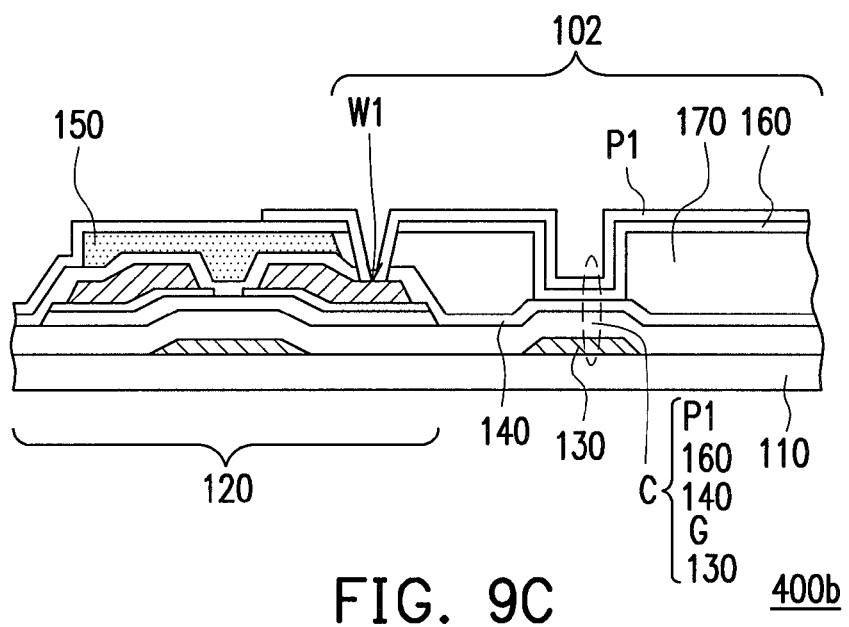

In another embodiment of the invention, after performing the aforementioned steps depicted in FIGS. 8A-8E, the step depicted in FIG. 9A is performed. In the present embodiment of the invention, while forming the patterned photoresist layer 180 on the buffer layer 160, only the first hole H1 is exposed. Thereafter, as shown in FIG. 9B, using the patterned photoresist layer 180 as a mask, an exposed portion of the buffer layer 160 and the passivation layer 140 under the buffer layer 160 are removed, for example by a dry etching process. Therefore, a contact hole W1 is formed. Next, as shown in FIG. 9C, the pixel electrode P1 is formed to complete the fabrication of a pixel structure 400b. At this time, the storage capacitor C includes the pixel electrode P1, the buffer layer 160, the passivation layer 140, the gate insulating layer G, and the capacitor electrode line 130.

Figure 10A:
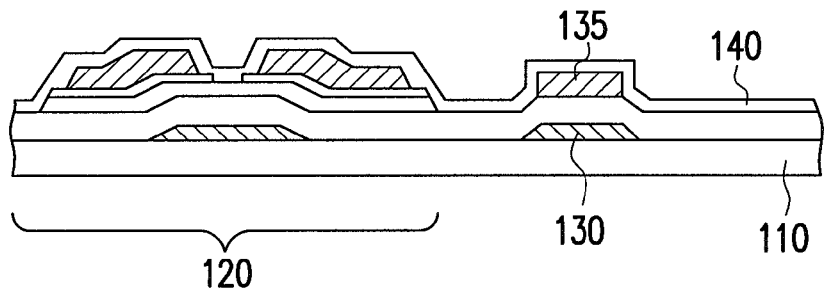
FIGS. 10A-10D are schematic views illustrating the steps for fabricating a pixel structure having a metal/insulator/metal structure storage capacitor in accordance with the third embodiment of the invention.
Figure 10B:
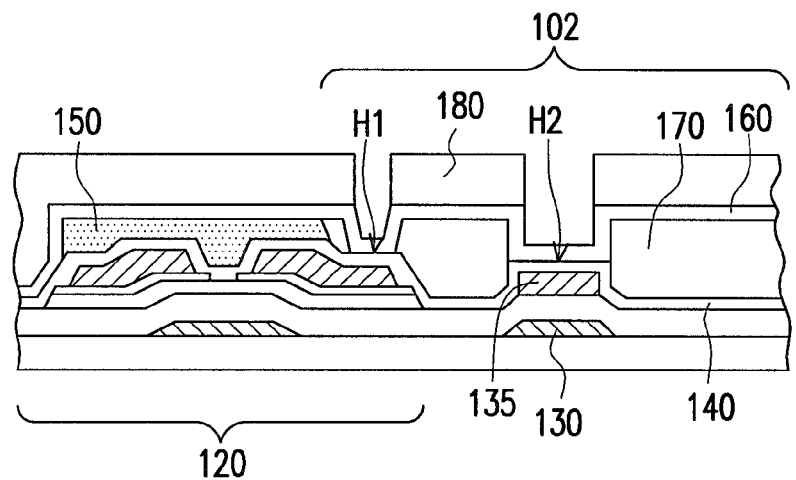

Similarly, the storage capacitor C in the aforementioned pixel structure can also have the metal/insulator/metal (MIM) structure. The fabrication method thereof is mostly similar to the pixel structure 400a according to the third embodiment of the invention. The differences therebetween are shown in FIG. 10A, before forming the passivation layer 140, the upper electrode pattern 135 is disposed above the capacitor electrode line 130. Next, referring to FIG. 10B after completing the steps depicted in FIGS. 8B-8E, the patterned photoresist layer 180 simultaneously exposes the buffer layer 160 above the first hole H1 and the second hole H2.

Figure 10C:
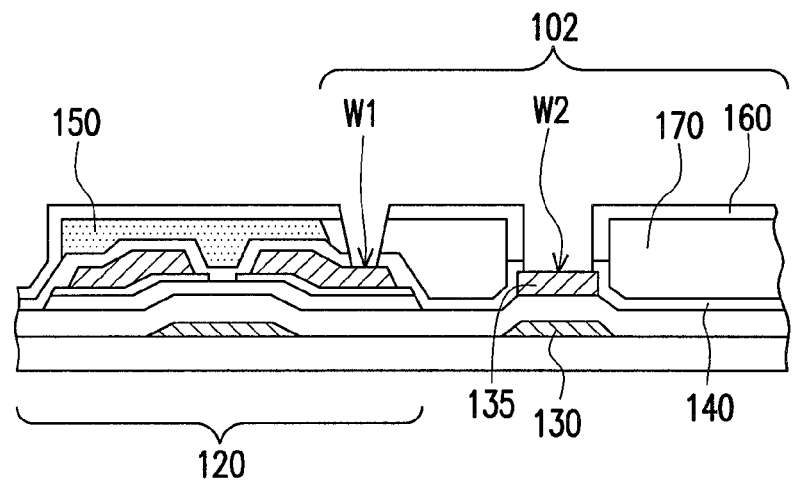

Thereafter, as shown in FIG. 10C, using the patterned photoresist layer 180 as a mask, the exposed portion of the buffer layer 160 and the passivation layer 140 under the buffer layer 160 are removed. Consequently, the first contact hole W1 and the second contact hole W2 are formed. The first contact hole W1 exposes a portion of the active device 120, whereas the second contact hole W2 exposes a portion of the upper electrode pattern 135.

Figure 10D:
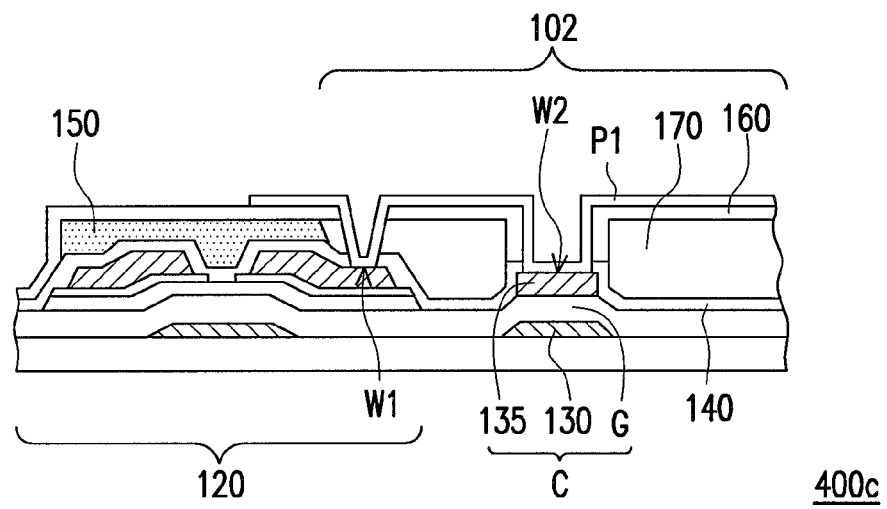

Next, referring to FIG. 10D, the pixel electrode P1 is formed on the color filter pattern 170 and the buffer layer 160. The pixel electrode P1 fills into the first contact hole W1 so as to electrically connect with the active device 120. The pixel electrode P1 fills into the second contact hole W2 so as to electrically connect with the upper electrode pattern 135. The capacitor electrode line 130, the gate insulating layer G, and the upper electrode pattern 135 form the storage capacitor C. By completing the above-described steps, a pixel structure 400c having the MIM structure storage capacitor C can be fabricated.

It should be noted that in other embodiments of the invention, through layout design of the pixel structure, the upper electrode pattern 135 can be electrically connected with the drain 123 of the active device 120. In other words, the upper electrode pattern 135 can be viewed as a part of the drain 123 of the active device 120. Therefore, by only forming the first contact hole W1 or the second contact hole W2, the pixel electrode P1 and the drain 123 (along with the upper electrode pattern 135) can be electrically connected. No further description is included herein, since reference can be directed to the metal/insulator/metal pixel structure previously described in FIG. 6 or 7.

In the above-described embodiment of the invention, forming the buffer layer 160 on the color filter pattern 170 is used as an example for description, but the invention is not limited thereto. In other embodiments of the invention, the buffer layer can be omitted. In other words, after forming the color filter pattern 170, the openings H1-H2, and the contact holes W1-W2, the pixel electrode P1 is formed on the surface of the color filter pattern 170.

The above-described first to third embodiments of the invention delineate the method for fabricating the pixel structure provided in the invention. By using processes such as backside exposure, dry etching, and laser removal, the area occupied by the light shielding layer can be decreased, thereby increasing the aperture ratio of the pixel structure.

Fourth Embodiment

Figure 11A:
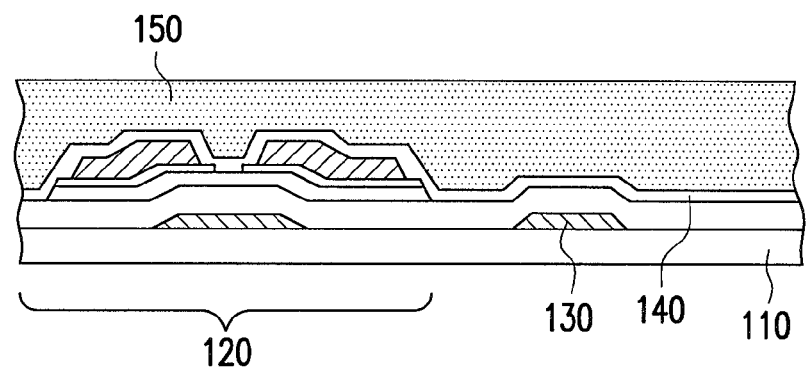
FIGS. 11A to 11F are schematic views illustrating the steps for fabricating a pixel structure in accordance with a fourth embodiment of the invention.

FIGS. 11A to 11F are schematic views illustrating the steps for fabricating a pixel structure in accordance with a fourth embodiment of the invention. Referring to FIG. 11A, first the substrate 110 is provided. A material of the substrate 110 includes glass, plastic, and other solid or soft materials, for example. The active device 120 and the capacitor electrode line 130 are already formed on the substrate 110. Next, the passivation layer 140 is formed, whereby the substrate 110 and the capacitor electrode line 130 are covered. Thereafter, the light shielding layer 150 is formed on the substrate 110. The dielectric constant of the light shielding layer 150 is less than 6. A material of the light shielding layer 150 is a photosensitive material, for example, and the material can be a positive or negative photoresist. In the present embodiment of the invention, the negative photoresist is used as an example for description.

Figure 11B:
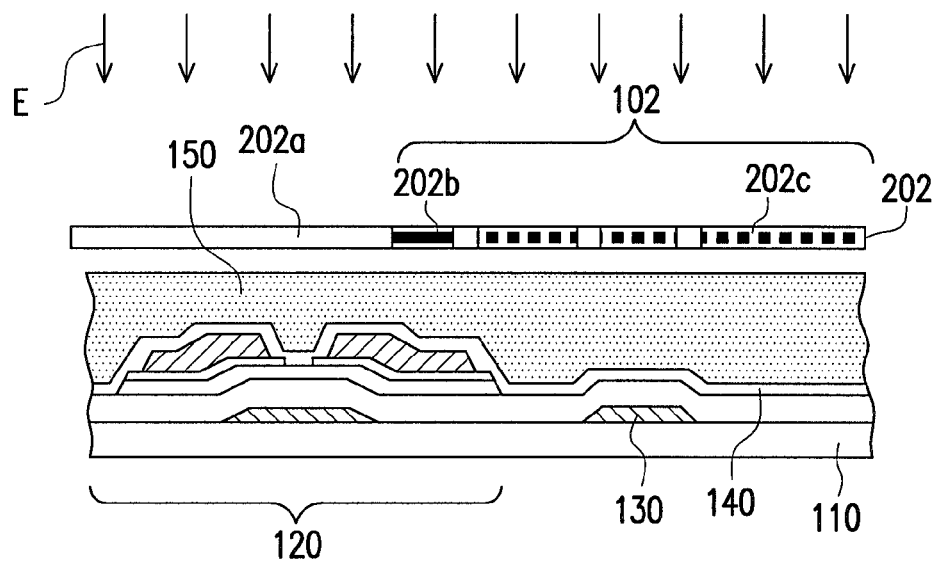
Figure 11C:
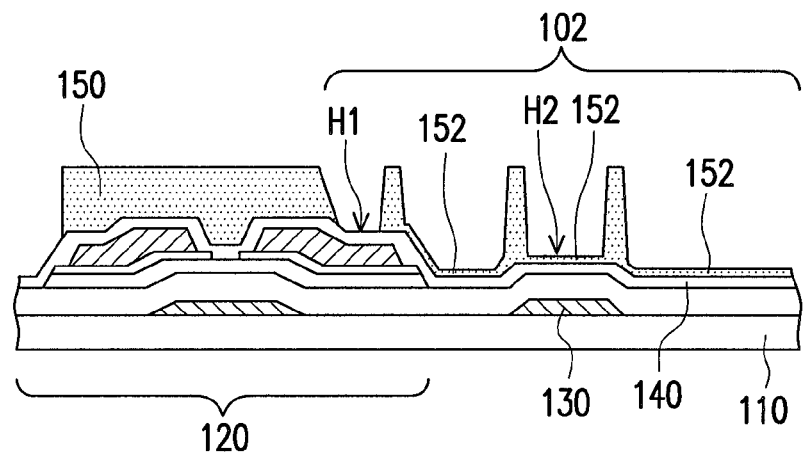

Referring to FIG. 11B, a mask 202 is disposed above the light shielding layer 150, in which the mask 202 is a half tone mask or a gray scale mask, for example. More specifically, the mask 202 has a transparent region 202a and a semi-transparent region 202c. Next, the exposure process E is performed on the light shielding layer 150. Thereafter, as shown in FIG. 11C, the development process is performed to pattern the light shielding layer 150, so as to define the unit area 102. At this time, the first hole H1 is simultaneously formed in the light shielding layer 150 above the active device 120, and the second hole H2 is formed in the light shielding layer 150 above the capacitor electrode line 130. Referring to FIG. 11C, the first hole H1 exposes the passivation layer 140 above the active device 120. Except where the first hole H1 is disposed in the unit area 102, a thin light shielding layer 152 covers the areas corresponding to the semi-transparent region 202c of the mask 202 depicted in FIG. 11B.

Figure 11D:
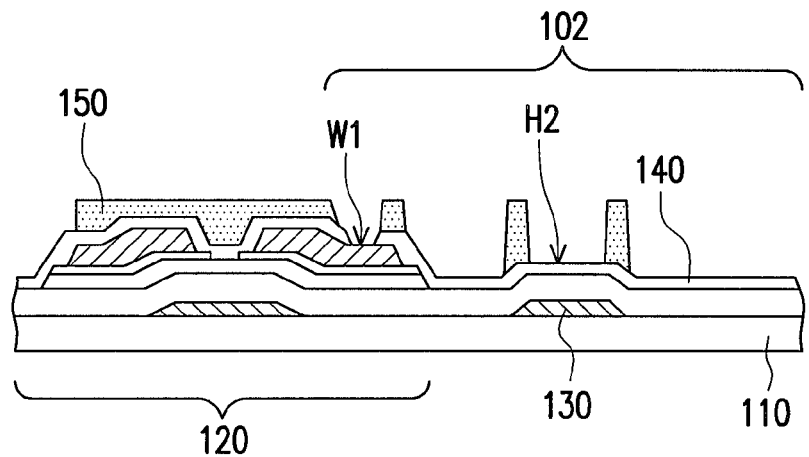

Thereafter, as shown in FIG. 11D, an etching process, for example the dry etching process, is performed to remove the passivation layer 140 exposed by the first hole H1, whereby the contact hole W1 is formed. The aforementioned dry etching process further includes removing the thin light shielding layer 152. It should be noted that, not only can the thin light shielding layer 152 be removed at the same time the contact hole W1 is formed, the thin light shielding layer 152 can also be removed by an ashing process after the dry etching process. In the present embodiment of the invention, while removing the passivation layer 140 under the first hole H1, the thin light shielding layer 152 can be used to prevent other portions of the passivation layer 140 from damage by the etching process. Moreover, the thin light shielding layer 152 and the light shielding layer 150 can be fabricated with the same or different materials.

Figure 11E:
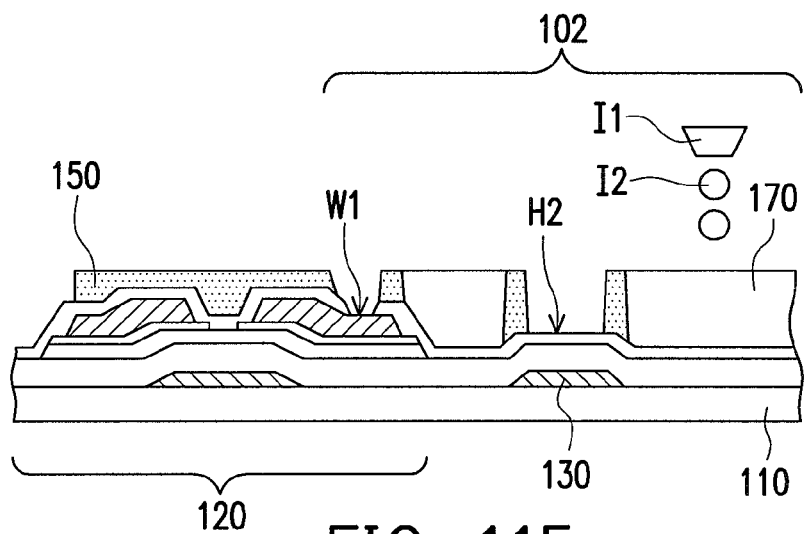

Next, referring to FIG. 11E, an ink-jet printing process I is performed, for example using an ink jet head I1 to inject an ink I2 into the transparent portion in the unit area 102. The ink I2 spreads uniformly in the unit area 102 to form the color filter pattern 170. The light shielding layer 150 is in the periphery of the contact hole W1 and the second hole H2, consequently the ink I2 does not flow into the contact hole W1 and the second hole H2. In the present embodiment of the invention, the dielectric constant of the color filter pattern 170 is less than 6.

Figure 11F:
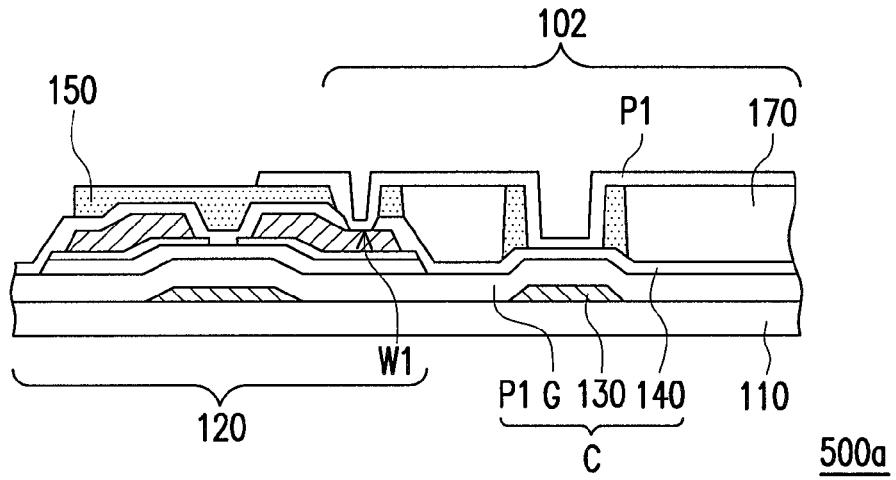

Thereafter, referring to FIG. 11F, the pixel electrode P1 is formed on the color filter pattern 170. Moreover, the pixel electrode P1 fills into the contact hole W1 so as to electrically connect with the active device 120. Additionally, the pixel electrode P1 further fills into the second hole H2 so as form the storage capacitor C with the capacitor electrode line 130. The storage capacitor C includes the pixel electrode P1, the passivation layer 140, the gate insulating layer G, and the capacitor electrode line 130. A pixel structure 500a is fabricated by following the aforementioned steps depicted in FIGS. 11A-11F.

Figure 12A:
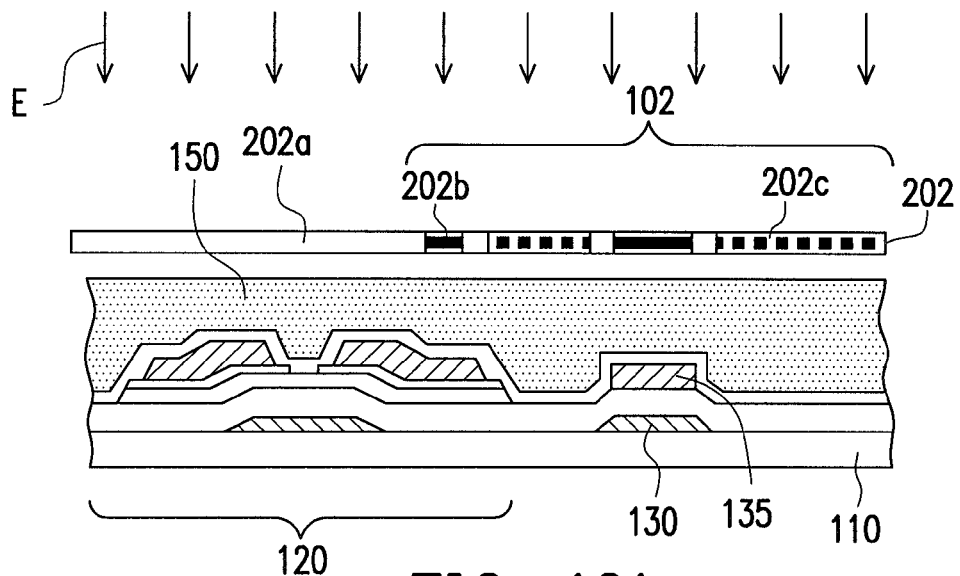
FIGS. 12A-12E are schematic views illustrating the steps for fabricating a pixel structure having a metal/insulator/metal structure storage capacitor in accordance with the fourth embodiment of the invention.
Figure 12B:
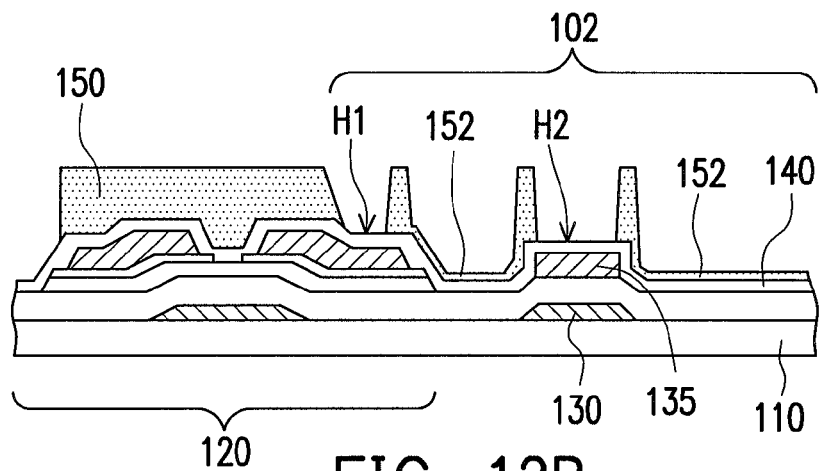

The aforementioned storage capacitor C can have a metal/insulator/metal (MIM) structure. The fabrication method thereof is mostly the same as the pixel structure 500a according to the above-described fourth embodiment. Referring to FIG. 12A, a difference is before forming the passivation layer 140, the upper electrode pattern 135 is disposed above the capacitor electrode line 130. After the step of forming the light shielding layer 150, the light shielding layer 150 is patterned to define the unit area 102. As shown in FIG. 12B, the first hole H1 is formed in the light shielding layer 150 above the active device 120, and the second hole H2 is formed in the light shielding layer 150 above the capacitor electrode line 130. It should be noted that, both the first hole H1 and the second hole H2 exposes the passivation layer 140, and in the unit area 102, except for where the first hole H1 and the second hole H2 are disposed, the thin light shielding layer 152 covers the unit area 102.

Figure 12C:
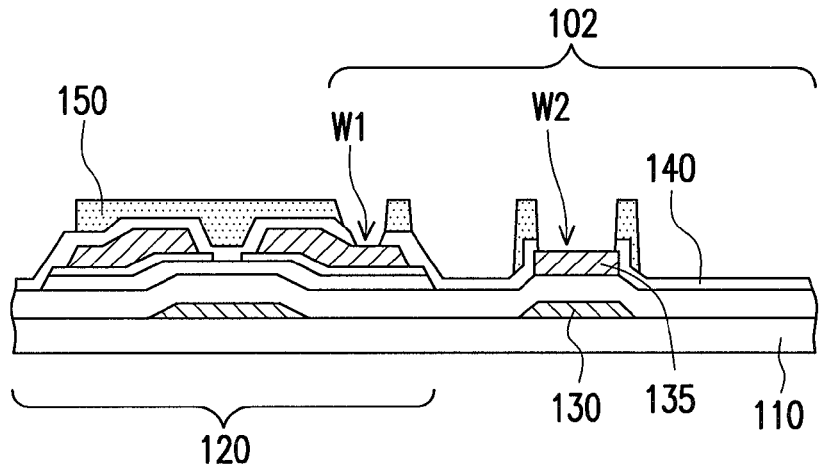

Next, referring to FIG. 12C, the etching process, for example the dry etching process, is performed. The portions of the passivation layer 140 exposed by the first hole H1 and the second hole H2 are removed, whereby the first contact hole W1 and the second contact hole W2 are formed. The aforementioned dry etching process further includes removing the thin light shielding layer 152. Likewise, not only can the thin light shielding layer 152 be removed at the same time the contact hole W1 is formed, the thin light shielding layer 152 can also be removed by the ashing process after the dry etching process.

Figure 12D:
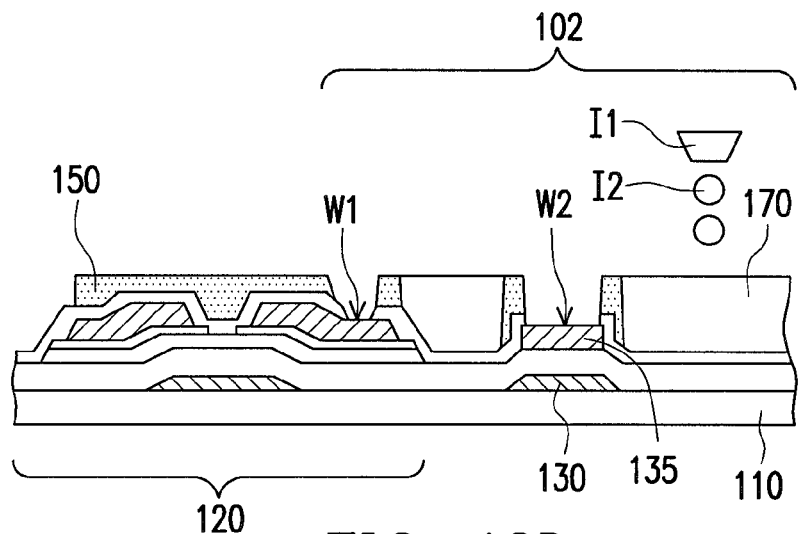

Next, referring to FIG. 12D, the ink jet printing process I is performed, for example using the ink-jet head I1 to inject the ink I2 into the transparent portion in the unit area 102. The ink I2 spreads uniformly in the unit area 102 to form the color filter pattern 170. The light shielding layer 150 is in the periphery of the first contact hole W1 and the second contact hole W2, consequently the ink I2 does not flow into the first contact hole W1 and the second contact hole W2.

Figure 12E:
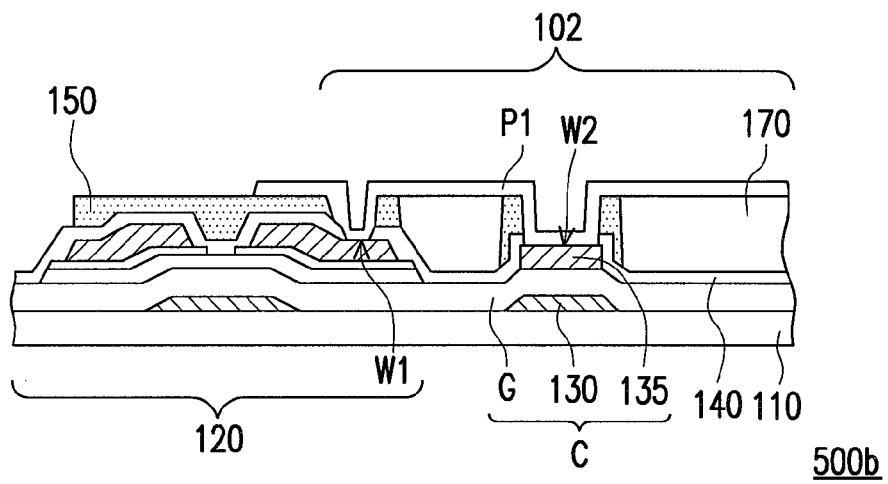

Thereafter, referring to FIG. 12E, the pixel electrode P1 is formed on the color filter pattern 170. Moreover, the pixel electrode P1 fills into the contact hole W1 so as to electrically connect with the active device 120. Additionally, the pixel electrode P1 fills into the second contact hole W2 so as to electrically connect with the upper electrode pattern 135. The capacitor electrode line 130, the gate insulating layer G, and the upper electrode pattern 135 form the storage capacitor C. By completing the above-described steps, a pixel structure 500b having a MIM structure storage capacitor C can be fabricated.

Figure 13A:
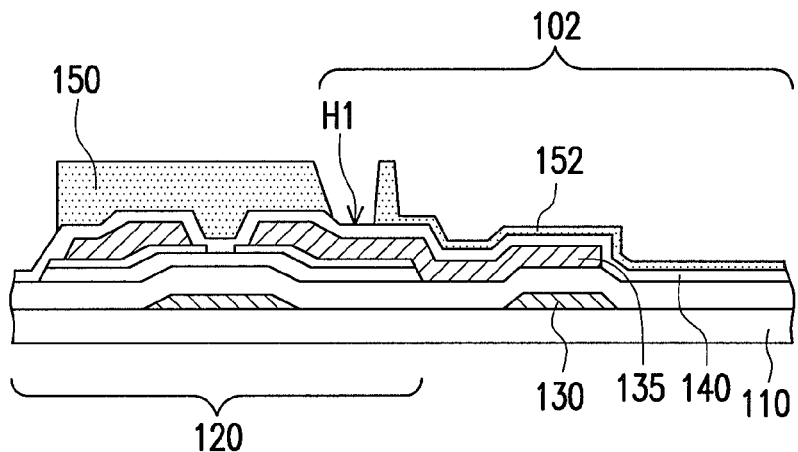
FIGS. 13A-13D are schematic views illustrating the steps for fabricating another pixel structure having a metal/insulator/metal structure storage capacitor in accordance with the fourth embodiment of the invention.

As shown in FIG. 13A, in another embodiment of the invention, in the step of forming the light shielding layer 150, the light shielding layer 150 has the first hole H1, and regions outside the first hole H1 are covered by the thin light shielding layer 152. Particularly, in the present embodiment of the invention, the upper electrode pattern 135 and the drain of the active device 120 are connected.

Figure 13B:
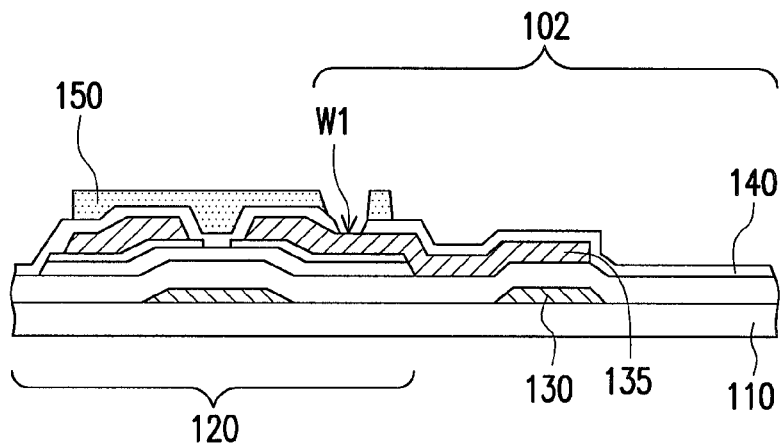

Thereafter, as shown in FIG. 13B, the etching process, for example the dry etching process, is performed to remove the passivation layer 140 exposed by the first hole H1, whereby the first contact hole W1 is formed.

Figure 13C:
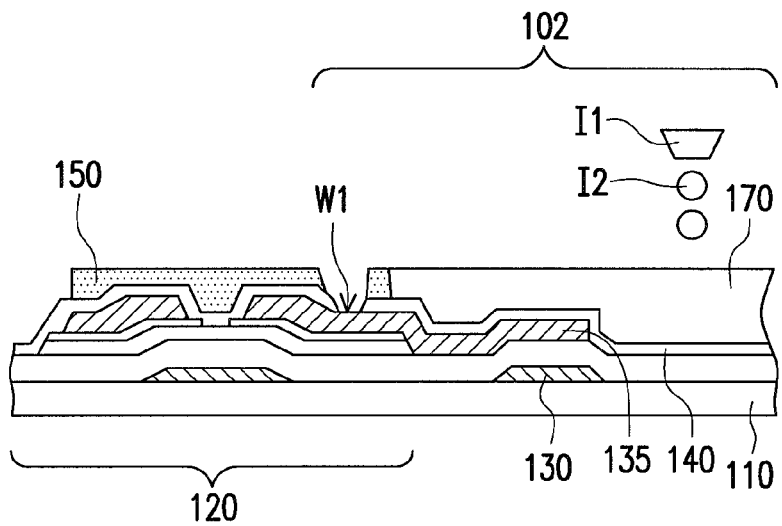

Next, as shown in FIG. 13C, the ink-jet printing process I is performed, for example using the ink jet head I1 to inject the ink I2 into the transparent portion in the unit area 102. The ink I2 spreads uniformly in the unit area 102 to form the color filter pattern 170. The light shielding layer 150 is in the periphery of the first contact hole W1, consequently the ink I2 does not flow into the contact hole W1.

Figure 13D:
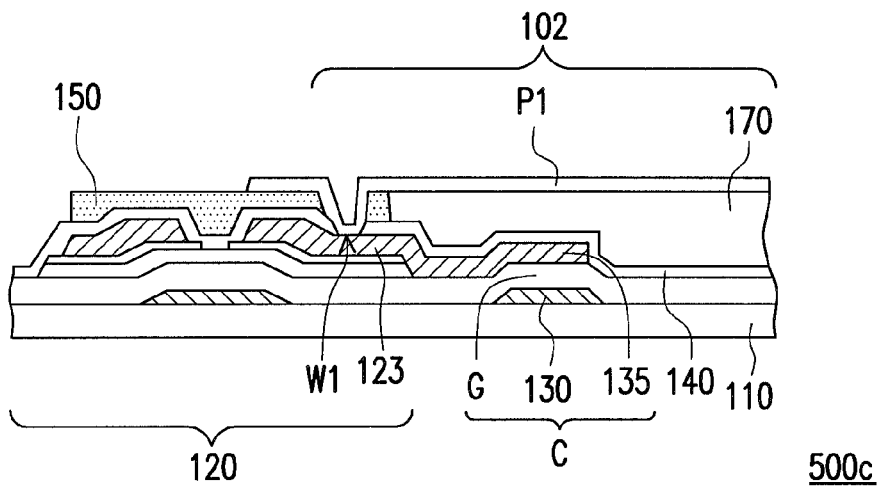

Thereafter, referring to FIG. 13D, the pixel electrode P1 is formed on the color filter pattern 170. Moreover, the pixel electrode P1 fills into the first contact hole W1 so as to electrically connect with the active device 120. By completing the above-described steps, a pixel structure 500c having the MIM structure storage capacitor C can be fabricated. Herein, the upper electrode pattern 135 and the drain 123 are electrically connected (not drawn). In other words, the upper electrode pattern 135 can be viewed as a part of the drain 123 of the active device 120.

Similarly, in another embodiment of the invention, the upper electrode pattern 135 and the drain of the active device 120 are electrically connected. In other words, the upper electrode pattern 135 can be viewed as a part of the drain 123 of the active device 120. Moreover, a contact hole is formed on the upper electrode pattern 135 to replace the first contact hole W1, and electrical connection with the drain of the active device 120 is established through the contact hole on the upper electrode pattern 135. No further description is included herein, since reference can be directed to the pixel structure having the MIM structure described above in FIG. 6 or 7.

In the fourth embodiment of the invention, the color filter pattern 170 is used as a mask for the patterned passivation layer 140. Therefore, the process of using the photoresist layer as the mask can be omitted. Moreover, since the light shielding layer 150 and the color filter pattern 170 are made of low dielectric constant materials (dielectric constant less than 6), formation of a buffer layer or a dielectric layer on the color filter pattern 170 is not required. Consequently, the fabrication process can be further simplified, thereby saving costs.

The Fifth Embodiment

Figure 14A:
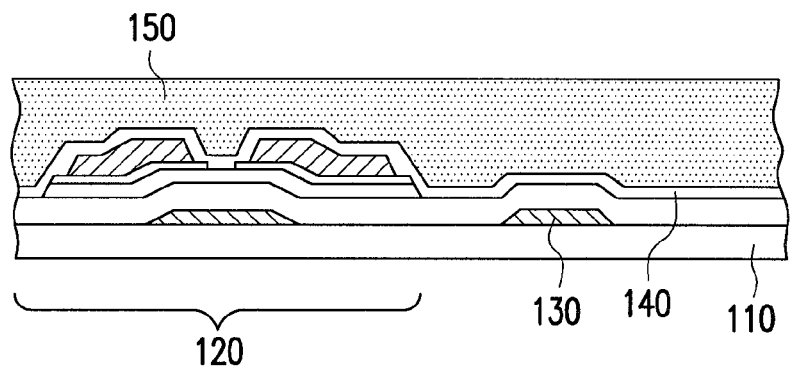
FIGS. 14A to 14F are schematic views illustrating the steps for fabricating a pixel structure in accordance with a fifth embodiment of the invention.

FIGS. 14A to 14F are schematic views illustrating the steps for fabricating a pixel structure in accordance with a fifth embodiment of the invention. The fabrication method of FIG. 14A is the same as for FIG. 11A, in which the dielectric constant of the light shielding layer is less than 6. A photosensitive material is used for the light shielding layer 150, for example, and the material can be a positive photoresist or a negative photoresist. In the present embodiment of the invention, the negative photoresist is used as an example for description. No further description is provided herein, since reference can be directed to the description of FIG. 11A.

Figure 14B:
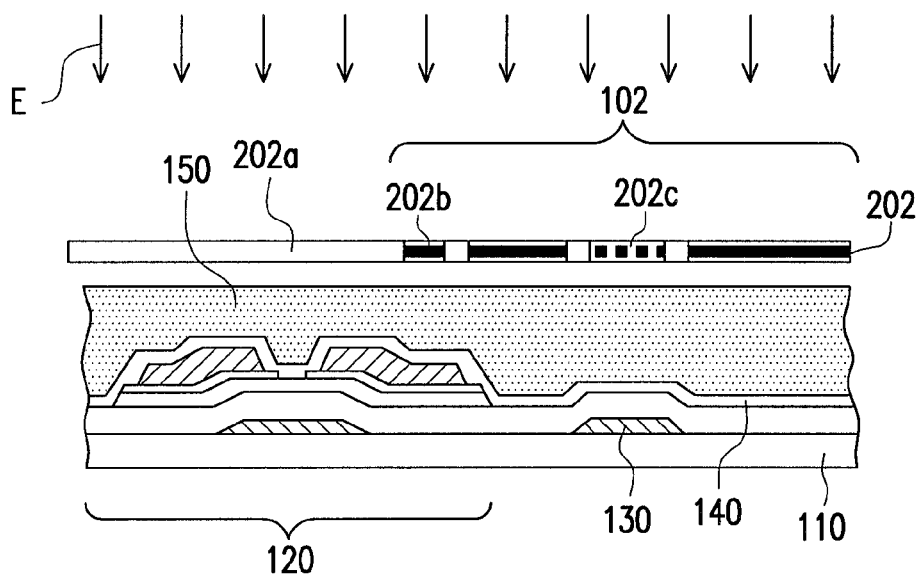
Figure 14C:
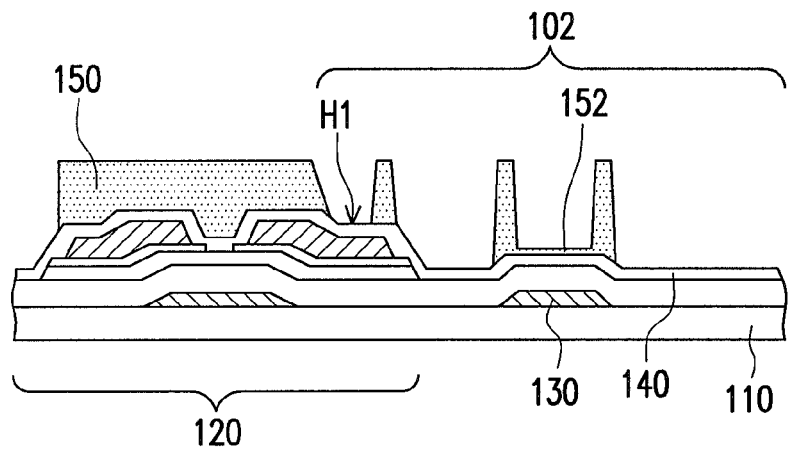

Next, referring to FIG. 14B, a mask 202 is disposed above the light shielding layer 150, in which the mask 202 is a half tone mask or a gray scale mask, for example. More specifically, the mask 202 has a transparent region 202a, a light-blocking region 202b, and a semi-transparent region 202c. Next, the exposure process E is performed on the light shielding layer 150. Thereafter, as shown in FIG. 14C, the development process is performed to pattern the light shielding layer 150, so as to define the unit area 102. At this time, the first hole H1 is simultaneously formed in the light shielding layer 150 above the active device 120. A thin light shielding layer 152 is formed in the light shielding layer 150 above the capacitor electrode line 130, corresponding to the semi-transparent region 202c of the mask 202 depicted in FIG. 14B.

Figure 14D:
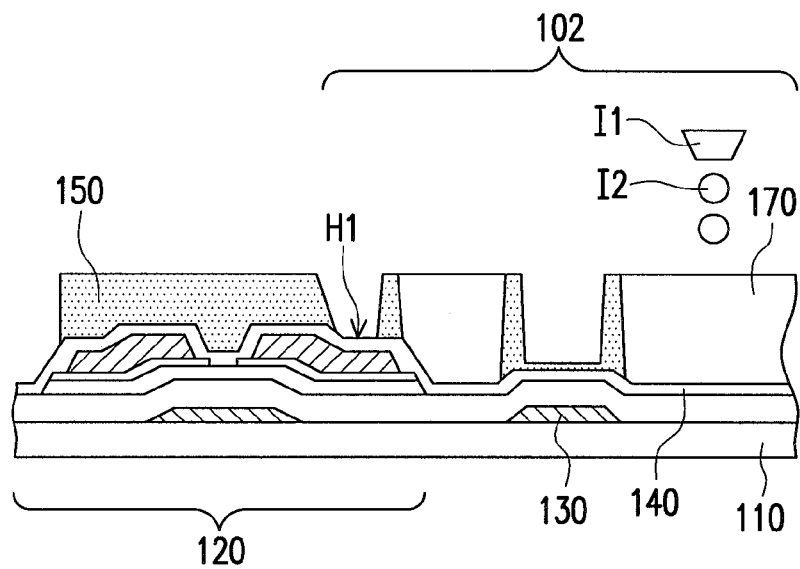

Next, referring to FIG. 14D, the ink jet printing process I is performed, for example using the ink-jet head I1 to inject the ink I2 into the transparent portion of the unit area 102. The ink I2 spreads uniformly in the unit area 102 to form the color filter pattern 170. The light shielding layer 150 is in the periphery of the first hole H1 and above the capacitor electrode line 130, consequently the ink I2 does not flow into the first hole H1 and the second hole H2 above the capacitor electrode line 130. It should be noted that for the color filter pattern 170 according to the present embodiment of the invention, the dielectric constant thereof is less than 6.

Figure 14E:
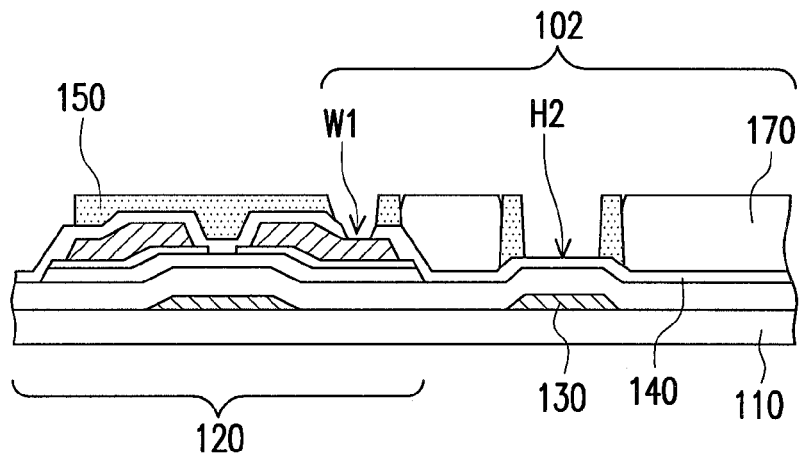

Thereafter, as shown in FIG. 14E, the etching process, for example the dry etching process, is performed to remove the passivation layer 140 exposed by the first hole H1, whereby the contact hole W1 is formed. The aforementioned dry etching process further includes removing the thin light shielding layer 152, so as to form the second hole H2. Likewise, not only can the thin light shielding layer 152 be removed at the same time the contact hole W1 is formed, the thin light shielding layer 152 can also be removed by the ashing process after the dry etching process.

It should be noted that, other than the thin light shielding layer 152, the differences between the fifth embodiment and the fourth embodiment is that the color filter pattern 170 can be used to prevent a portion of the passivation layer 140 from damage by the etching process.

Figure 14F:
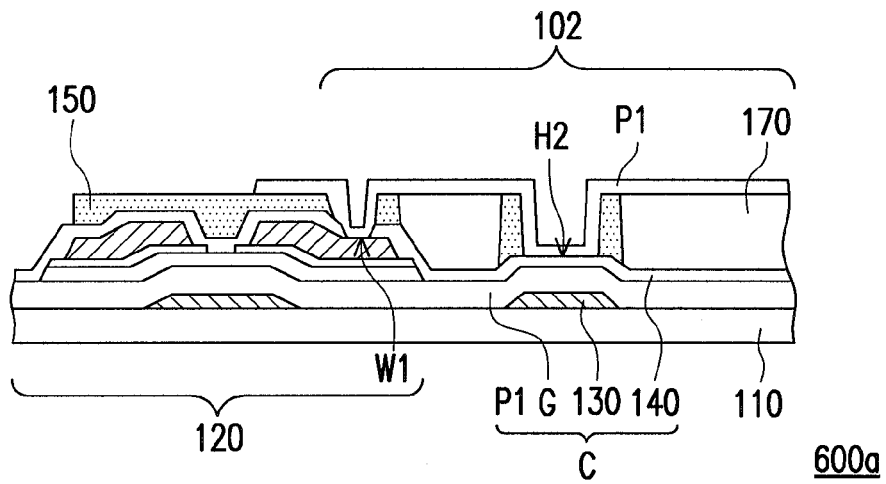

Thereafter, referring to FIG. 14F, the pixel electrode P1 is formed on the color filter pattern 170. Moreover, the pixel electrode P1 fills into the first contact hole W1 so as to electrically connect with the active device 120. Moreover, the pixel electrode P1 further fills into the second hole H2 so as to form the storage capacitor C with the capacitor electrode line 130. The storage capacitor C includes the pixel electrode P1, the passivation layer 140, the gate insulating layer G, and the capacitor electrode line 130. A pixel structure 600a is fabricated by following the aforementioned steps depicted in FIGS. 14A-14F.

Figure 15A:
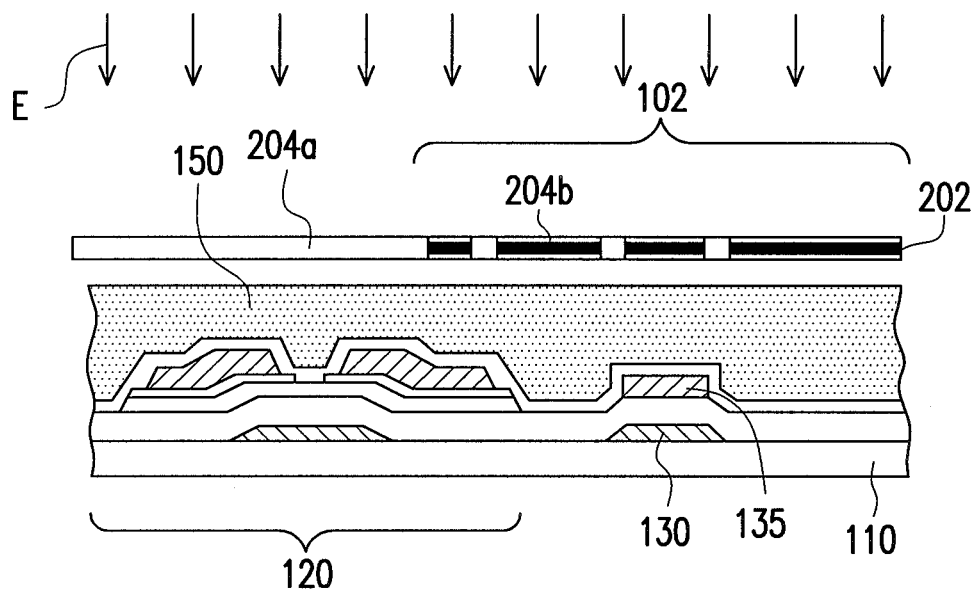
FIGS. 15A-15E are schematic views illustrating the steps for fabricating a pixel structure having a metal/insulator/metal structure storage capacitor in accordance with the fifth embodiment of the invention.
Figure 15B:
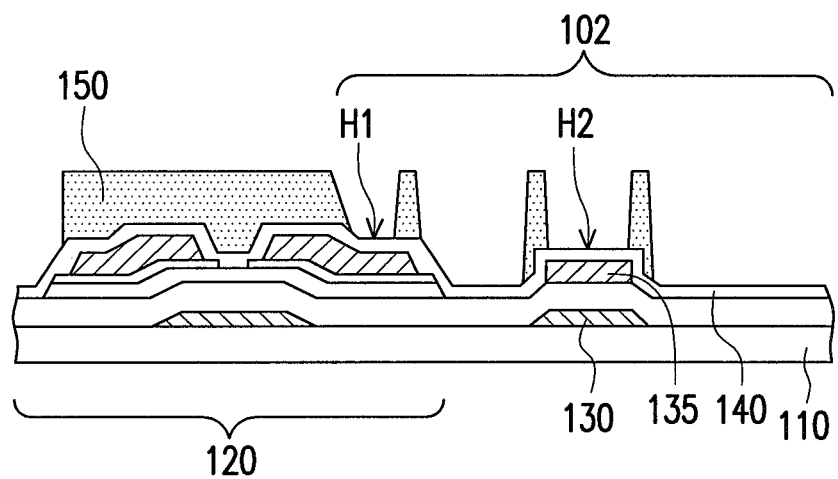

The aforementioned storage capacitor C can have a metal/insulator/metal (MIM) structure. The fabrication method thereof is similar to the pixel structure 600a according to the above-described fifth embodiment. Referring to FIG. 15A, a difference is before forming the passivation layer 140, the upper electrode pattern 135 is disposed above the capacitor electrode line 130. After the step of forming the light shielding layer 150, a mask 202 is disposed above the light shielding layer 150. More specifically, the mask 202 has the transparent region 202a and the light-blocking region 202b. Next, the exposure process E is performed on the light shielding layer 150. Thereafter, the development process is performed for patterning the light shielding layer 150 to define the unit area 102. As shown in FIG. 15B, the first hole H1 is formed in the light shielding layer 150 above the active device 120, and the second hole H2 is formed in the light shielding layer 150 above the capacitor electrode line 130. The first hole H1 and the second hole H2 both expose the passivation layer 140.

Figure 15C:
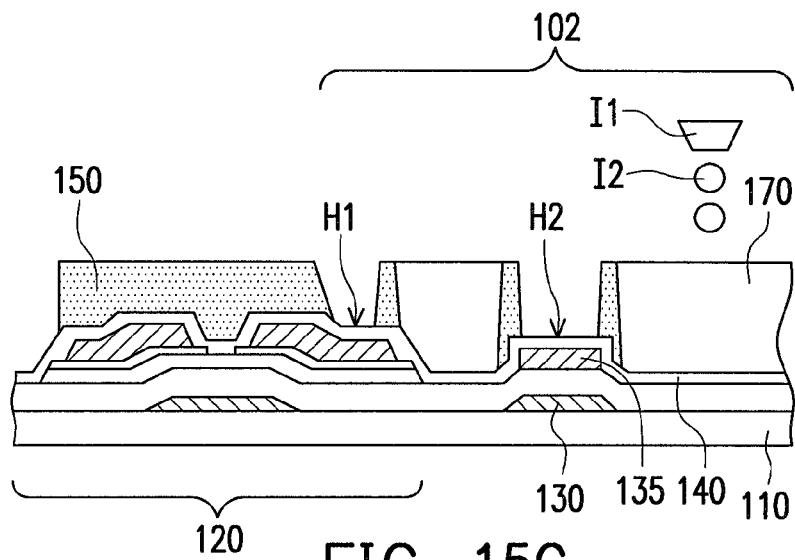

Next, referring to FIG. 15C, the ink jet printing process I is performed, for example using the ink-jet head I1 to inject the ink I2 into the transparent portion in the unit area 102. The ink I2 spreads uniformly in the unit area 102 to form the color filter pattern 170. The light shielding layer 150 is in the periphery of the first hole H1 and the second hole H2, consequently the ink I2 does not flow into the first hole W1 and the second hole H2.

Figure 15D:
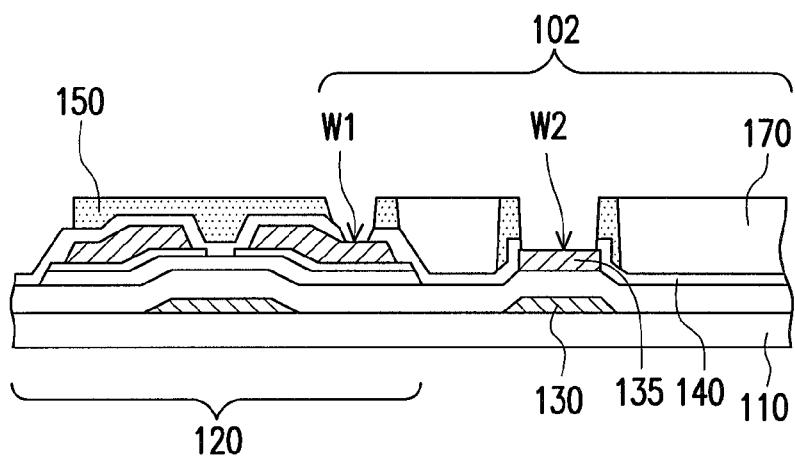

Next, referring to FIG. 15D, the etching process, for example the dry etching process, is performed. The portions of the passivation layer 140 exposed by the first hole H1 and the second hole H2 are removed, whereby the first contact hole W1 and the second contact hole W2 are formed.

Figure 15E:
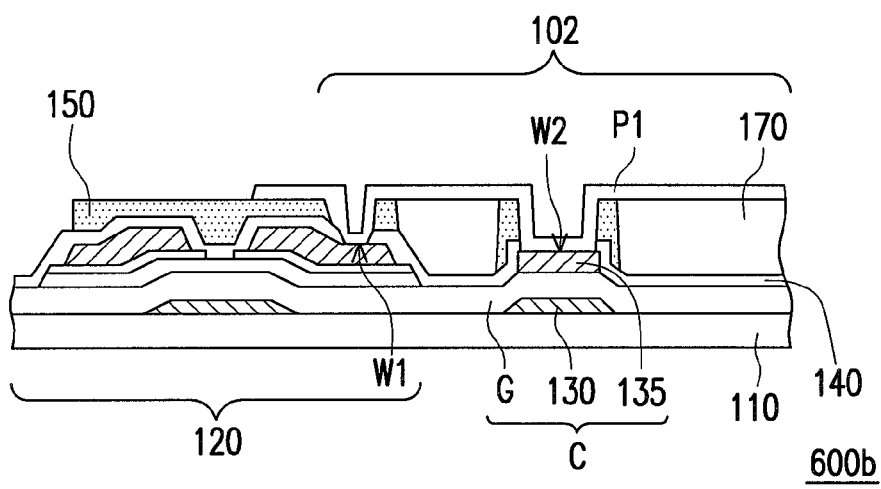

Thereafter, referring to FIG. 15E, the pixel electrode P1 is formed on the color filter pattern 170. The pixel electrode P1 fills into the contact hole W1 so as to electrically connect with the active device 120. Additionally, the pixel electrode P1 fills into the second contact hole W2 so as to electrically connect with the upper electrode pattern 135. The capacitor electrode line 130, the gate insulating layer G, and the upper electrode pattern 135 form the storage capacitor C. By completing the above-described steps, a pixel structure 600b having a MIM structure storage capacitor C can be fabricated.

In the fifth embodiment of the invention, besides using the light shielding layer 150 as the mask of the passivation layer 140, an example of using the color filter pattern 170 as the mask is further described.

Moreover, in other embodiments of the invention, through layout design of the pixel structure, the upper electrode pattern 135 can be electrically connected with the drain 123. In other words, the upper electrode pattern 135 can be viewed as a part of the drain 123 of the active device 120. Therefore, in order for the pixel electrode P1 and the drain 123 (along with the upper electrode pattern 135) to be electrically connected, only the first contact hole W1 or the second contact hole W2 needs to be formed. No further description is included herein, since reference can be directed to the pixel structure having the MIM structure described above in FIG. 6 or 7.

The Sixth Embodiment

FIGS. 16A to 16E are schematic views illustrating the steps for fabricating a pixel structure in accordance with a sixth embodiment of the invention.

Figure 16A:
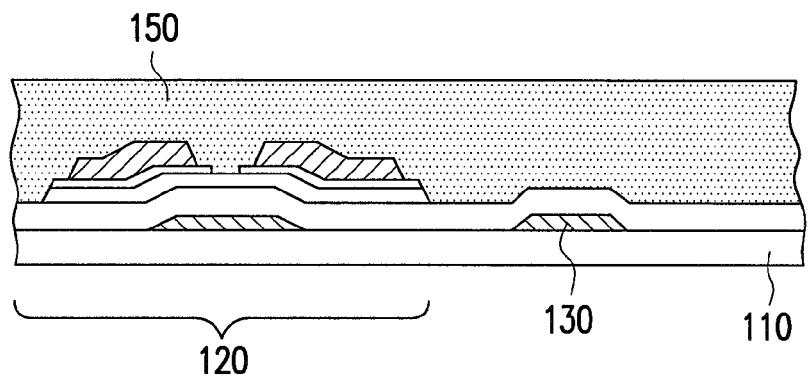
FIGS. 16A to 16E are schematic views illustrating the steps for fabricating a pixel structure in accordance with a sixth embodiment of the invention.

Referring to FIG. 16A, first a substrate 110 is provided. A material of the substrate 110 includes glass, plastic, and other solid or soft materials. The active device 120 and the capacitor electrode line 130 are already formed on the substrate 110. Thereafter, the light shielding layer 150 is formed on the substrate 110. The dielectric constant of the light shielding layer 150 is less than 6. A material of the light shielding layer 150 is a photosensitive material, for example, and the material can be a positive or negative photoresist. In the present embodiment of the invention, the negative photoresist is used as an example for description. It should be noted that, compared with the foregoing embodiments, the main difference of the present embodiment is that no passivation layer exists between the active device 120 and the light shielding layer 150.

Figure 16B:
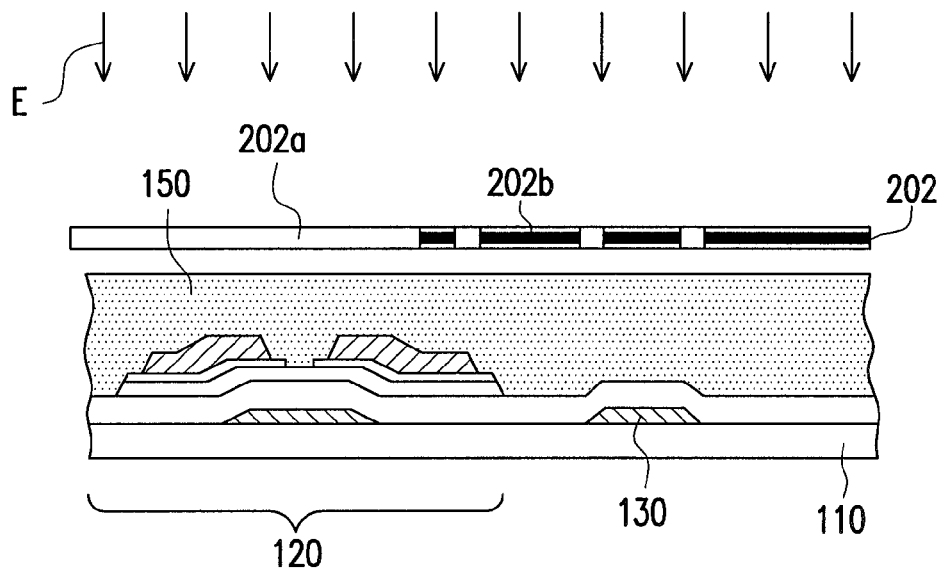
Figure 16C:
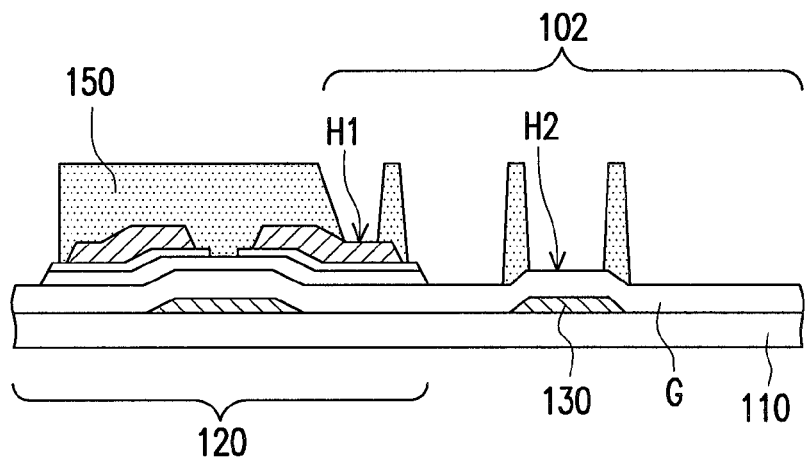

Thereafter, referring to FIG. 16B, a mask 202 is disposed above the light shielding layer 150. The mask 202 has the transparent region 202a and the light-blocking region 202b. Next, the exposure process E is performed on the light shielding layer 150. Thereafter, as shown in FIG. 16C, the development process is performed to pattern the light shielding layer 150, so as to define the unit area 102. At this time, the first hole H1 is simultaneously formed in the light shielding layer 150 above the active device 120, and the second hole H2 is formed in the light shielding layer 150 above the capacitor electrode line 130. The first hole H1 exposes the active device 120, and the second hole H2 exposes the gate insulating layer G above the capacitor electrode line 130.

Figure 16D:
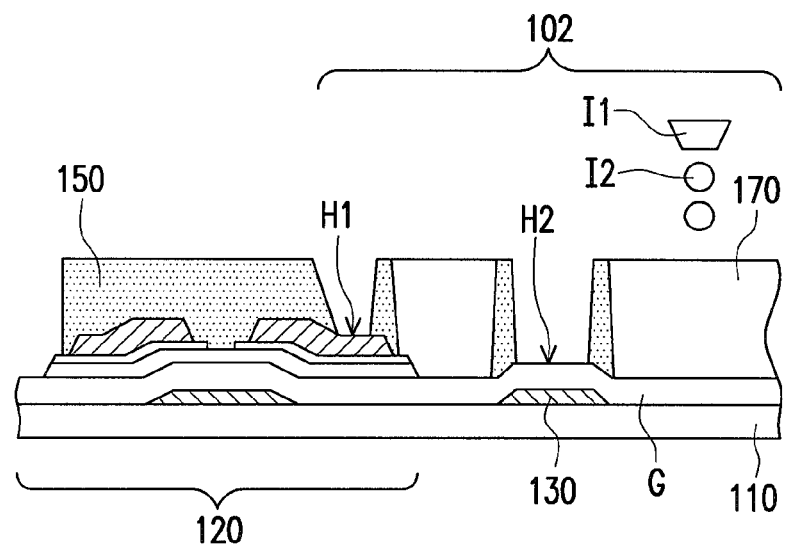

Next, referring to FIG. 16D, the ink-jet printing process I is performed, for example using the ink jet head I1 to inject the ink I2 into the transparent portion in the unit area 102. The ink I2 spreads uniformly in the unit area 102 to form the color filter pattern 170. The light shielding layer 150 is in the periphery of the first hole H1 and the second hole H2, consequently the ink I2 does not flow into the first hole H1 and the second hole H2. In the present embodiment of the invention, the dielectric constant of the color filter pattern 170 is less than 6.

Figure 16E:
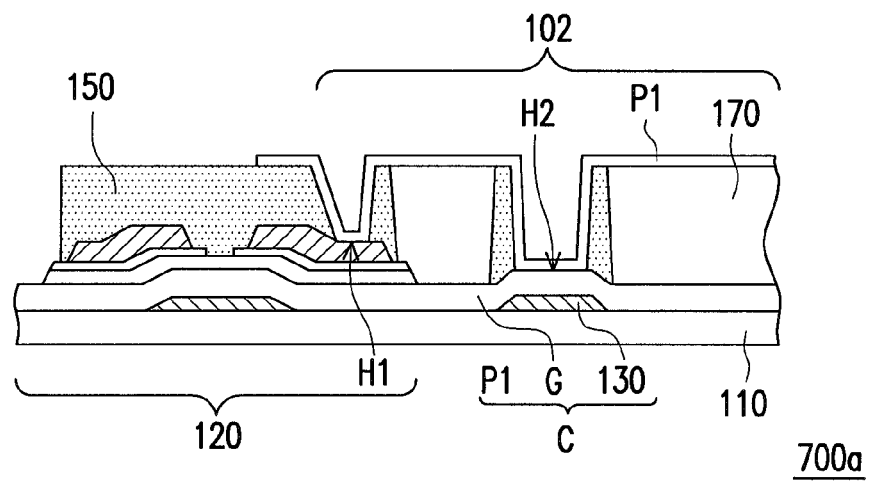

Thereafter, referring to FIG. 16E, the pixel electrode P1 is formed on the color filter pattern 170. The pixel electrode P1 fills into the first hole H1 so as to electrically connect with the active device 120. Moreover, the pixel electrode P1 further fills into the second hole H2 so as to form the storage capacitor C with the capacitor electrode line 130. The storage capacitor C includes the pixel electrode P1, the gate insulating layer G, and the capacitor electrode line 130. A pixel structure 700a is fabricated by following the foregoing steps depicted in FIGS. 16A-16E.

The aforementioned storage capacitor C can have a metal/insulator/metal (MIM) structure. The fabrication method thereof is mostly the same as the pixel structure 700a according to the above-described sixth embodiment.

Figure 17:
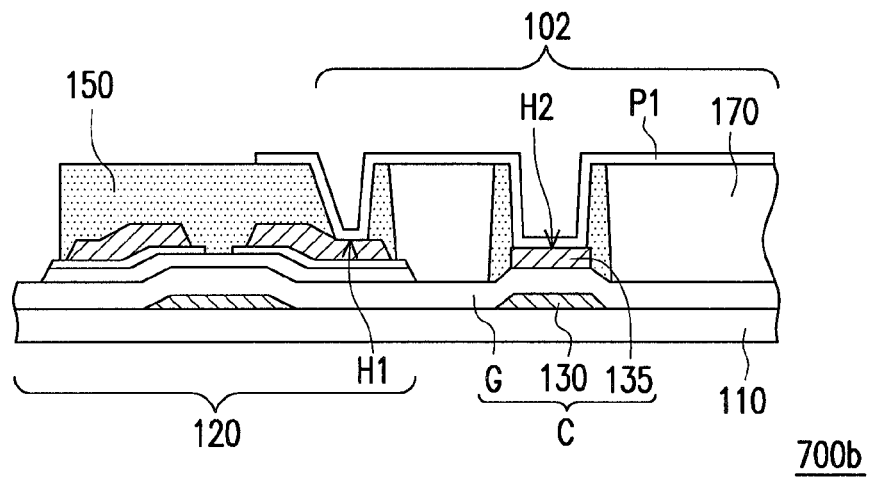
FIG. 17 is a schematic view illustrating a pixel structure having a metal/insulator/metal structure storage capacitor in accordance with the sixth embodiment of the invention.

FIG. 17 is a schematic view illustrating a pixel structure having a metal/insulator/metal structure storage capacitor in accordance with the sixth embodiment of the invention. Referring to FIG. 17, the capacitor electrode line 130, the gate insulating layer G, and the upper electrode pattern 135 form the storage capacitor C. Compared to the pixel structure 700a, a difference of a pixel structure 700b is that the upper electrode pattern 135 is disposed above the capacitor electrode line 130. No further description on the fabrication method thereof is provided herein.

In other embodiments of the invention, through layout design of the pixel structure, the upper electrode pattern 135 can be electrically connected with the drain 123. In other words, the upper electrode pattern 135 can be viewed as a part of the drain 123 of the active device 120. Therefore, in order for the pixel electrode P1 and the drain 123 (along with the upper electrode pattern 135) to be electrically connected, only the first hole H1 or the second hole H2 needs to be formed. No further description is included herein, since reference can be directed to the pixel structure having the MIM structure described above in FIG. 6 or 7.

In the foregoing fabrication method of the pixel structure according to the sixth embodiment of the invention, the fabrication process is simplified because the passivation layer 140 between the active device 120 and the light shielding layer 150 is omitted, thereby also saving the etching process afterwards to form the contact hole.

The Seventh Embodiment

FIGS. 18A-18G are schematic views illustrating the steps for fabricating a pixel structure in accordance with a seventh embodiment of the invention.

Figure 18A:
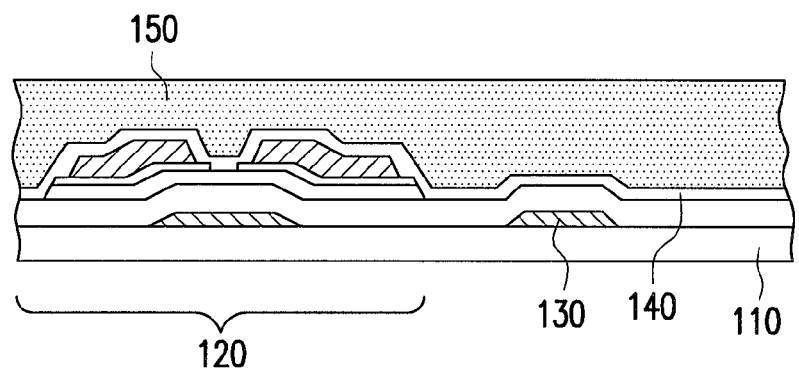
FIGS. 18A-18G are schematic views illustrating the steps for fabricating a pixel structure in accordance with a seventh embodiment of the invention.

Referring to FIG. 18A, first a substrate 110 is provided. A material of the substrate 110 includes glass, plastic, and other solid or soft materials. The active device 120 and the capacitor electrode line 130 are already formed on the substrate 110. Next, the passivation layer 140 is formed, whereby the substrate 110 and the capacitor electrode line 130 are covered. Thereafter, the light shielding layer 150 is formed on the substrate 110. The dielectric constant of the light shielding layer 150 is less than 6. A material of the light shielding layer 150 is a photosensitive material, for example, and the material can be a positive or negative photoresist. In the present embodiment of the invention, the negative photoresist is used as an example for description.

Figure 18B:
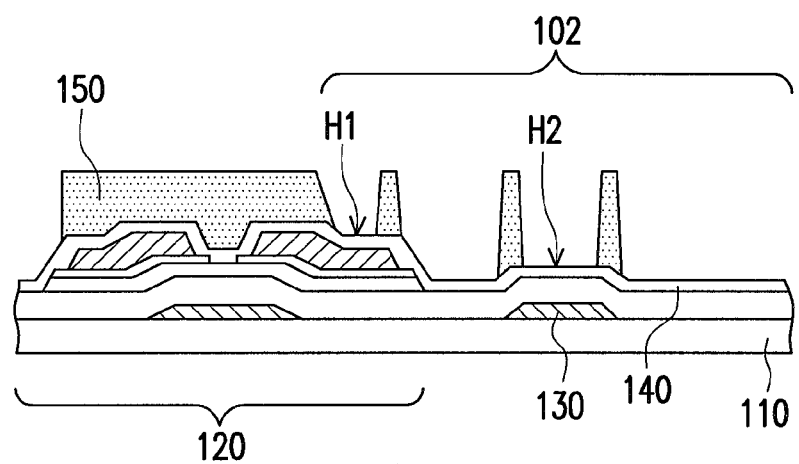

Next, referring to FIG. 18B, after the step of patterning the light shielding layer 150, the unit area 102 is defined. At this time, a first hole H1 is simultaneously formed in the light shielding layer 150 above the active device 120. Moreover, the second hole H2 is formed in the light shielding layer 150 above the capacitor electrode line 130. The first hole H1 and the second hole H2 expose the passivation layer 140 above the active device 120. In the seventh embodiment of the invention, the step for patterning the light shielding layer 150 has been described in the foregoing FIG. 15B according to the fifth embodiment of the invention. Therefore, no further description is provided herein.

Figure 18C:
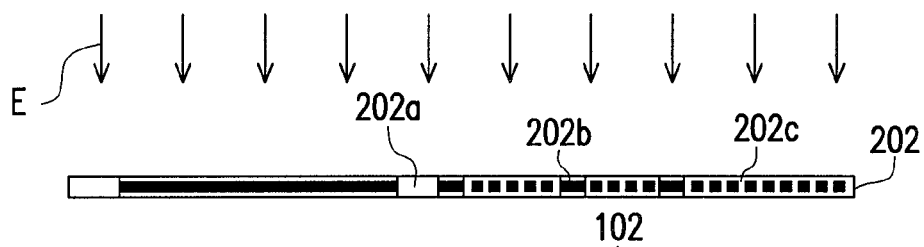
Figure 18C:
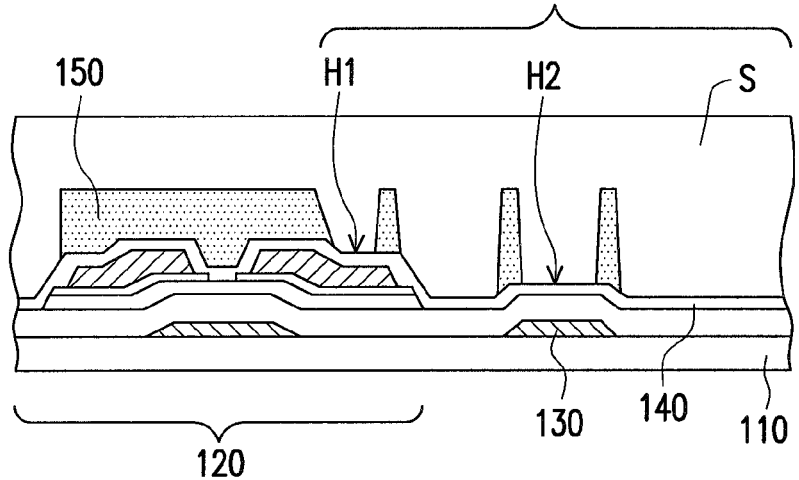

Thereafter, referring to FIG. 18C, a water repelling layer S is formed, whereby the patterned light shielding layer 150 and the passivation layer 140 are covered thereon. A material of the water repelling layer S is a photosensitive material, for example, and the material can be a positive or negative photoresist. In the present embodiment of the invention, the positive photoresist is used as an example for description. It should be noted that forming the water repelling layer S on the light shielding layer 150 can help restrict the color filter pattern (not drawn) within the region defined by the light shielding layer 150.

Figure 18D:
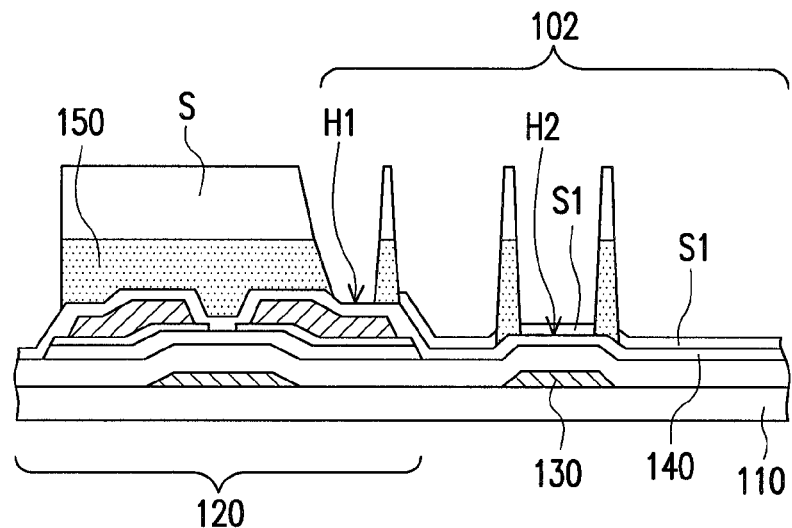

Referring to FIG. 18B, a mask 202 is disposed above the water repelling layer S, in which the mask 202 is a half tone mask or a gray scale mask, for example. More specifically, the mask 202 has the transparent region 202a, the light-blocking region 202b, and the semi-transparent region 202c. Next, the exposure process E is performed on the water repelling layer S. Thereafter, as shown in FIG. 18D, the development process is performed to pattern the water repelling layer S. At this time, the first hole H1 is simultaneously exposed in the water repelling layer S above the active device 120. The first hole H1 exposes the passivation layer 140 above the active device 120. Except where the first hole H1 is disposed in the unit area 102, a thin water repelling layer S1 covers the areas corresponding to the semi-transparent region 202c of the mask 202 depicted in FIG. 18C.

Figure 18E:
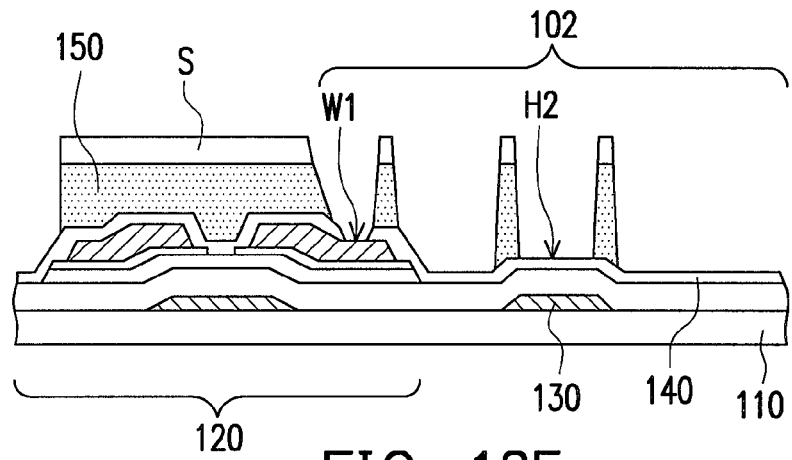

Thereafter, referring to FIG. 18E, the etching process, for example the dry etching process, is performed to remove the passivation layer 140 exposed by the first hole H1, whereby the contact hole W1 is formed. The foregoing dry etching process further includes removing the thin water repelling layer S1. Likewise, not only can the thin water repelling layer S1 be removed at the same time the contact hole W1 is formed, the thin water repelling layer S1 can also be removed by the ashing process after the dry etching process. In the present embodiment of the invention, while removing the passivation layer 140 under the first hole H1, the thin water repelling layer S1 can be used to prevent other portions of the passivation layer 140 from damage by the etching process.

Figure 18F:
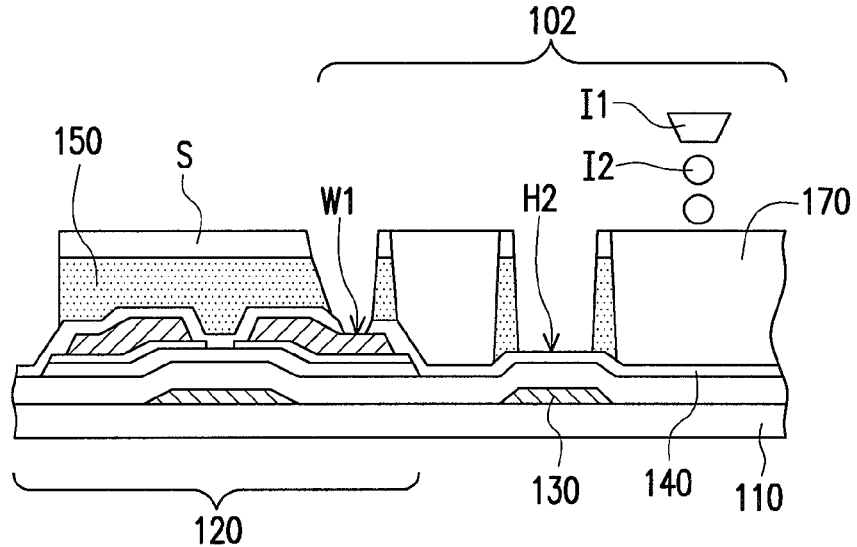

Next, referring to FIG. 18F, the ink-jet printing process I is performed, for example using the ink-jet head I1 to inject the ink I2 into the transparent portion in the unit area 102. The ink I2 spreads uniformly in the unit area 102 to form the color filter pattern 170. The light shielding layer 150 and the water repelling layer S are in the periphery of the contact hole W1 and the second hole H2, consequently the ink I2 does not flow into the contact hole W1 and the second hole H2. In the present embodiment of the invention, the dielectric constant of the color filter pattern 170 is less than 6.

Figure 18G:
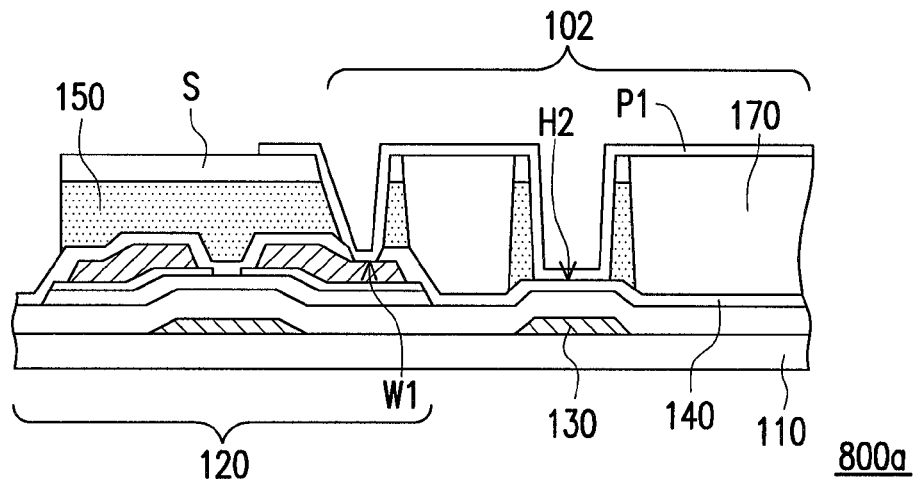

Thereafter, referring to FIG. 18G, the pixel electrode P1 is formed on the color filter pattern 170. The color filter pattern 170 fills into the contact hole W1 so as to electrically connect with the active device 120. Moreover, the pixel electrode P1 further fills into the second hole H2 so as to form the storage capacitor C with the capacitor electrode line 130. The storage capacitor C includes the pixel electrode P1, the passivation layer 140, the gate insulating layer G, and the capacitor electrode line 130. By completing the foregoing steps depicted in FIGS. 18A-18G, the fabrication of a pixel structure 800a is mostly complete.

The aforementioned storage capacitor C can have the metal/insulator/metal (MIM) structure. The fabrication method thereof is mostly the same as the pixel structure 800a according to the above-described seventh embodiment.

Figure 19:
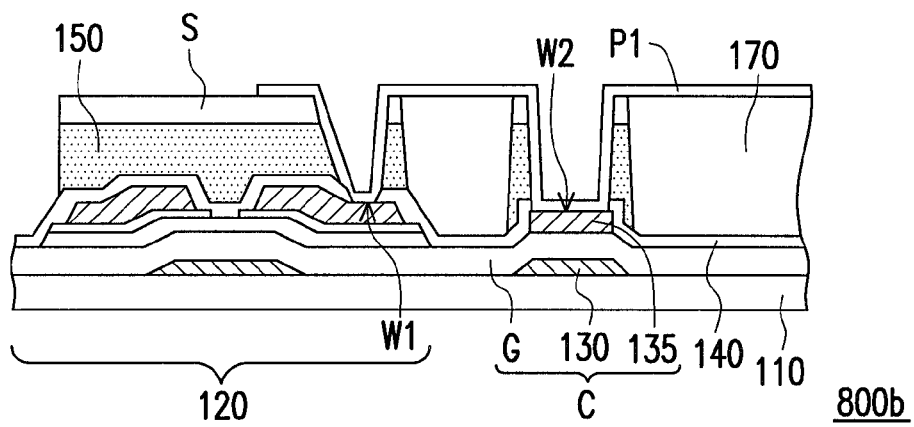
FIG. 19 is a schematic view illustrating a pixel structure having a metal/insulator/metal structure storage capacitor in accordance with the seventh embodiment of the invention.

FIG. 19 is a schematic view illustrating a pixel structure having a metal/insulator/metal structure storage capacitor in accordance with the seventh embodiment of the invention. Referring to FIG. 19, the capacitor electrode line 130, the gate insulating layer G, and the upper electrode pattern 135 form the storage capacitor C. Compared to the pixel structure 800a, a difference of a pixel structure 800b is that the upper electrode pattern 135 is disposed above the capacitor electrode line 130. No further description on the fabrication method thereof is provided herein.

In other embodiments of the invention, through layout design of the pixel structure, the upper electrode pattern 135 can be electrically connected with the drain 123 of the active device 120. In other words, the upper electrode pattern 135 can be viewed as a part of the drain 123 of the active device 120. Therefore, in order for the pixel electrode P1 and the drain 123 (along with the upper electrode pattern 135) to be electrically connected, only the first contact hole W1 or the second contact hole W2 needs to be formed. No further description is included herein, since reference can be directed to the pixel structure having the MIM structure described above in FIG. 6 or 7.

In the foregoing method of fabricating the pixel structure according to the seventh embodiment, the description mainly details the fabrication of the water repelling layer S, which can be formed above the light shielding layer.

The Eighth Embodiment

FIGS. 20A-20F are schematic views illustrating the steps for fabricating a pixel structure in accordance with an eighth embodiment of the invention.

Figure 20A:
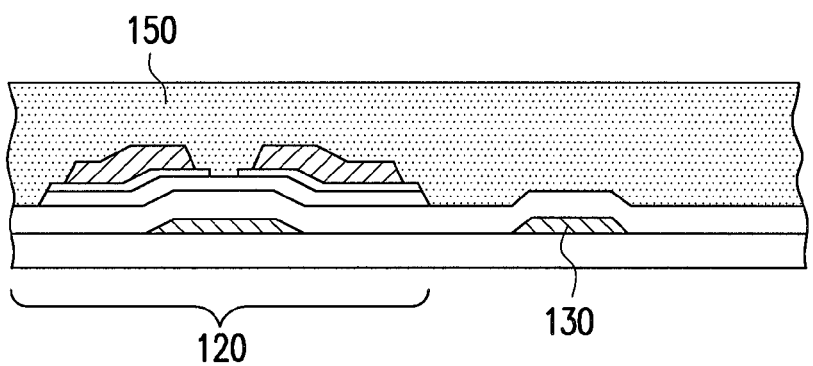
FIGS. 20A-20F are schematic views illustrating the steps for fabricating a pixel structure in accordance with an eighth embodiment of the invention.

Referring to FIG. 20A, first the substrate 110 is provided. A material of the substrate 110 includes glass, plastic, and other solid or soft materials. The active device 120 and the capacitor electrode line 130 are already formed on the substrate 110. Thereafter, the light shielding layer 150 is formed on the substrate 110. The dielectric constant of the light shielding layer 150 is less than 6. A material of the light shielding layer 150 is a photosensitive material, for example, and the material can be a positive or negative photoresist. In the present embodiment of the invention, the negative photoresist is used as an example for description. It should be noted that, compared with the seventh embodiment of the invention, a difference of the present embodiment is that no passivation layer exists between the active device 120 and the light shielding layer 150.

Figure 20B:
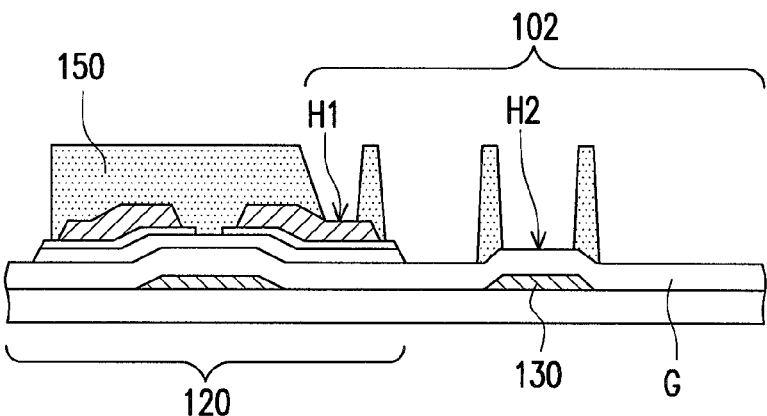

Next, referring to FIG. 20B, after the step of patterning the light shielding layer 150, the unit area 102 is defined. At this time, the first hole H1 is simultaneously formed in the light shielding layer 150 above the active device 120. The second hole H2 is formed in the light shielding layer 150 above the capacitor electrode line 130. The first hole H1 exposes a portion of the active device 120. In the eighth embodiment of the invention, the step for patterning the light shielding layer 150 has been described in FIG. 15B according to the foregoing fifth embodiment of the invention. Therefore, no further description is provided herein.

Figure 20C:
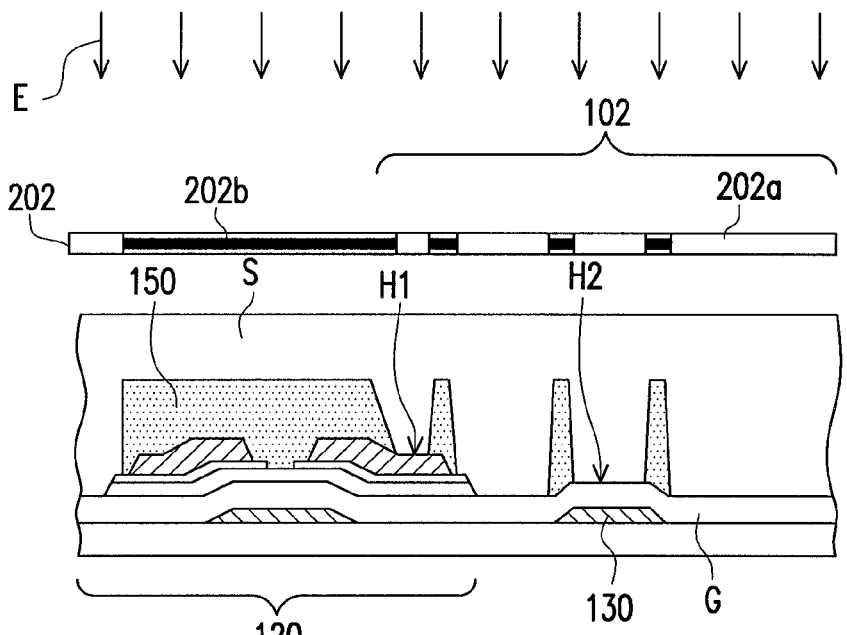
Figure 20D:
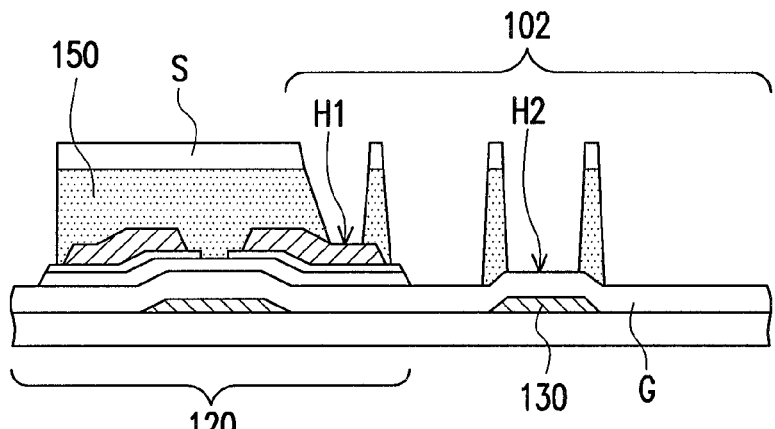

Thereafter, referring to FIG. 20C, the water repelling layer S is formed, whereby the patterned light shielding layer 150 and the gate insulating layer G are covered. A material of the water repelling layer S is a photosensitive material, for example, and the material can be a positive or negative photoresist. In the present embodiment of the invention, the positive photoresist is used as an example for description.

Referring to FIG. 20C, the mask 202 is disposed on the water repelling layer S, and the mask 202 has the transparent region 202a and the light-blocking region 202b. Next, the exposure process E is performed on the water repelling layer S. Thereafter, as shown in FIG. 18D, the development process is performed to pattern the water repelling layer S. At this time, the first hole H1 is simultaneously exposed in the water repelling layer S above the active device 120, and the second hole H2 is exposed in the water repelling layer S above the capacitor electrode line 130.

Figure 20E:
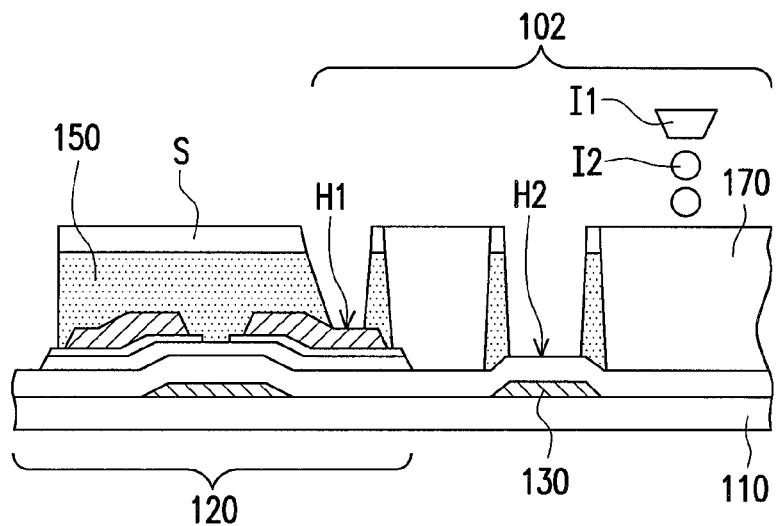

Next, referring to FIG. 20E, the ink jet printing process I is performed, for example using the ink-jet head I1 to inject the ink I2 into the transparent portion in the unit area 102. The ink I2 spreads uniformly in the unit area 102 to form the color filter pattern 170. The light shielding layer 150 and the water repelling layer S are in the periphery of the first hole H1 and the second hole H2, consequently the ink I2 does not flow into the first hole H1 and the second hole H2. In the present embodiment of the invention, the dielectric constant of the color filter pattern 170 is less than 6.

Figure 20F:
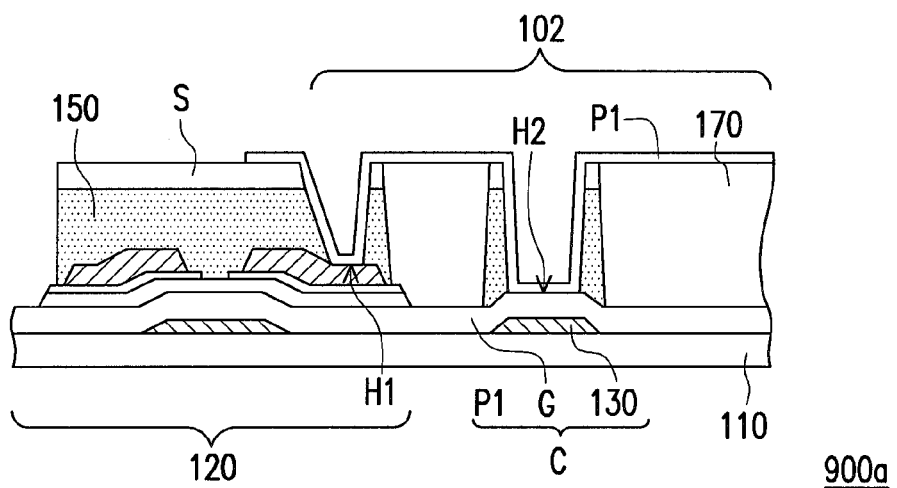

Thereafter, referring to FIG. 20F, the pixel electrode P1 is formed on the color filter pattern 170. The pixel electrode P1 fills into the first hole H1 so as to electrically connect with the active device 120. Moreover, the pixel electrode P1 further fills into the second hole H2 so as to form the storage capacitor C with the capacitor electrode line 130. The storage capacitor C includes the pixel electrode P1, the gate insulating layer G, and the capacitor electrode line 230. A pixel structure 900a is fabricated by following the aforementioned steps depicted in FIGS. 20A-20F.

The aforementioned storage capacitor C can have a metal/insulator/metal (MIM) structure. The fabrication method thereof is mostly the same as the pixel structure 900a according to the above-described eighth embodiment.

Figure 21:
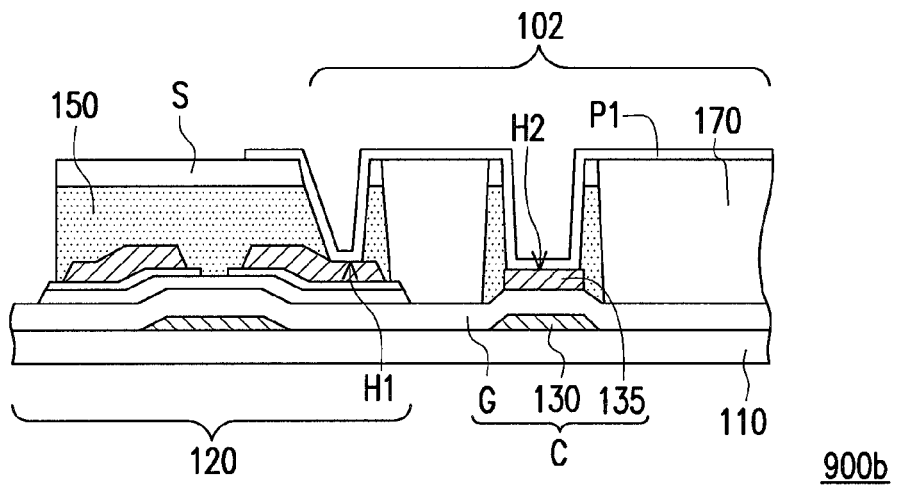
FIG. 21 is a schematic view illustrating a pixel structure having a metal/insulator/metal structure storage capacitor in accordance with the eighth embodiment of the invention.

FIG. 21 is a schematic view illustrating a pixel structure having a metal/insulator/metal structure storage capacitor in accordance with the eighth embodiment of the invention. Referring to FIG. 21, the capacitor electrode line 130, the gate insulating layer G, and the upper electrode pattern 135 form the storage capacitor C. Compared to the pixel structure 900a, a difference of a pixel structure 900b is that the upper electrode pattern 135 is disposed above the capacitor electrode line 130. No further description on the fabrication method thereof is provided herein.

In other embodiments of the invention, through layout design of the pixel structure, the upper electrode pattern 135 can be electrically connected with the drain 123 of the active device 120. In other words, the upper electrode pattern 135 can be viewed as a part of the drain 123 of the active device 120. Therefore, in order for the pixel electrode P1 and the drain 123 (along with the upper electrode pattern 135) to be electrically connected, only the first contact hole W1 or the second contact hole W2 needs to be formed. No further description is included herein, since reference can be directed to the pixel structure having the MIM structure described above in FIG. 6 or 7.

The foregoing fourth to eighth embodiments describe a fabrication method using a light shielding layer and a color filter pattern of dielectric constant less than 6 to replace the buffer layer or the passivation layer.

In light of foregoing, the method for fabricating the pixel structure provided by embodiments of the present invention has at least the following advantages.

1. The method for fabricating the pixel structure provided by some embodiments of the invention can use backside exposure, dry etching, or laser removal processes to remove the color filter pattern above the drain and the storage capacitor. Consequently, in these embodiments, formation of the light shielding layer above the drain and the storage capacitor is not required, thereby increasing the aperture ratio of the pixel structure.

2. The method for fabricating the pixel structure provided by some embodiments of the invention can use the backside exposure process to pattern the color filter pattern. Therefore, usage of the photomask is reduced, and consequently the fabrication process is simplified and costs are also reduced.

3. The method for fabricating the pixel structure provided by some embodiments of the invention can use the light shielding layer and the color filter pattern to replace the buffer layer (i.e. the dielectric layer), whereby the passivation layer is protected from damage by the subsequent etching process.

4. The method for fabricating the pixel structure provided by some embodiments of the invention can use the low dielectric constant light shielding layer and color filter pattern to replace the passivation layer and buffer layer, thereby further simplifying the fabrication processes and saving manufacturing costs.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A pixel structure, comprising:
an active device and a capacitor electrode line disposed on a substrate, wherein the active device includes a gate, a source, and a drain;
a passivation layer covering the active device;
a light shielding layer disposed on the passivation layer, to define a unit area, wherein the light shielding layer does not cover the capacitor electrode line within the unit area;
a color filter pattern disposed in the unit area defined by the light shielding layer, wherein the color filter pattern above the active device has a first hole, the passivation layer under the first hole has a contact hole, the contact hole exposes the drain, and the drain has a plurality of hole patterns; and
a pixel electrode disposed on the color filter pattern, wherein the pixel electrode electrically connects with the active device through the contact hole.

2. The pixel structure as claimed in claim 1, wherein the color filter pattern above the capacitor electrode line has a second hole, and the pixel electrode fills into the second hole so as to form a storage capacitor with the capacitor electrode line.

3. The pixel structure as claimed in claim 2, further comprising a buffer layer covering the light shielding layer and the color filter pattern.

4. The pixel structure as claimed in claim 1, further comprising an upper electrode pattern disposed above the capacitor electrode line, and the upper electrode pattern is electrically connected with the active device.

5. The pixel structure as claimed in claim 4, wherein the contact hole exposes the upper electrode pattern or the active device.

6. A pixel structure, comprising:
an active device and a capacitor electrode line disposed on a substrate;
a light shielding layer disposed on the substrate, wherein the dielectric constant of the light shielding layer is less than 6, the light shielding layer defining a unit area on the substrate, and a contact hole is in the light shielding layer above the active device, wherein the light shielding layer is in contact with the active device;
a color filter pattern disposed in the unit area, wherein the dielectric constant of the color filter pattern is less than 6, and the color filter pattern does not fill into the contact hole; and
a pixel electrode disposed on the color filter pattern, wherein the pixel electrode fills into the contact hole so as to electrically connect with the active device, and the pixel electrode is in contact with the color filter pattern.

7. The pixel structure as claimed in claim 6, further comprising a water repelling layer disposed on a top surface of the light shielding layer.

8. The pixel structure as claimed in claim 6, further comprising a passivation layer disposed under the light shielding layer.

9. The pixel structure as claimed in claim 6, wherein the light shielding layer above the capacitor electrode line has a second hole, the color filter pattern does not fill into the second hole, and the pixel electrode fills into the second hole so as to form a storage capacitor with the capacitor electrode line.

10. The pixel structure as claimed in claim 6, further comprising an upper electrode pattern disposed above the capacitor electrode line.

11. The pixel structure as claimed in claim 10, wherein the contact hole exposes the upper electrode pattern or the active device.

* * * * *